United States Patent
Yamada et al.

[11] Patent Number: 6,163,145
[45] Date of Patent: *Dec. 19, 2000

[54] TRANSPORTING APPARATUS FOR SEMICONDUCTOR DEVICE

[75] Inventors: Hiromichi Yamada; Kunio Kobayashi; Sekio Ito; Eiri Yuhara; Shinji Semba, all of Tokyo; Jiro Takamura, Hyogo; Shinji Sogabe, Tokyo; Hiroyuki Shinmen, Tokyo; Mitsuru Yamazaki, Tokyo, all of Japan

[73] Assignees: Mitsubishi Denki Kabushiki Kaisha; Mitsubishi Electric Engineering Co., Ltd., both of Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/917,922

[22] Filed: Aug. 27, 1997

[30] Foreign Application Priority Data

Feb. 20, 1997 [JP] Japan .................................... 9-036348

[51] Int. Cl.⁷ .............................. G01R 1/04; G01R 31/02; G01R 31/26; B65G 59/02
[52] U.S. Cl. ...................... 324/158.1; 324/760; 324/765; 414/796.5
[58] Field of Search ................................. 324/158.1, 765, 324/760, 754, 755; 414/416, 404, 222.01, 222.07, 222.08, 331.13, 331.14, 331.17, 788.7, 796

[56] References Cited

U.S. PATENT DOCUMENTS

| | | | |
|---|---|---|---|
| 4,103,232 | 7/1978 | Sugita et al. | 324/158.1 |
| 4,541,762 | 9/1985 | Tischler et al. | 414/788.7 |
| 4,687,403 | 8/1987 | Motoda | 414/788.7 |
| 4,971,514 | 11/1990 | Hunter | 414/788.7 |
| 5,096,369 | 3/1992 | Ouellette | 414/788.7 |
| 5,148,100 | 9/1992 | Sekiba | 324/765 |
| 5,290,134 | 3/1994 | Baba | 414/404 |
| 5,307,011 | 4/1994 | Tani | 324/158.1 |
| 5,313,156 | 5/1994 | Klug et al. | 324/158.1 |
| 5,348,441 | 9/1994 | Takemasa et al. | 414/788.7 |
| 5,812,409 | 9/1998 | Kanno et al. | 324/158.1 |

FOREIGN PATENT DOCUMENTS

| | | |
|---|---|---|
| 19615919 A1 | 10/1996 | Germany . |
| 19639004 A1 | 3/1997 | Germany . |
| 19644509 A1 | 4/1997 | Germany . |
| 19581661 C2 | 11/1998 | Germany . |
| 60-223198 | 11/1985 | Japan . |
| 1-167684 | 7/1989 | Japan . |
| 4-115546 | 4/1992 | Japan . |
| 7-111281 | 4/1995 | Japan . |
| 8-105938 | 4/1996 | Japan . |
| 8-194032 | 7/1996 | Japan . |

*Primary Examiner*—Vinh P. Nguyen
*Assistant Examiner*—Jermele M. Hollington
*Attorney, Agent, or Firm*—McDermott, Will & Emery

[57] ABSTRACT

A transporting apparatus used in testing a plurality of semiconductor devices includes a magazine in which a plurality of pallets are stacked in plural stages, each pallet with a plurality of semiconductor device placed thereon; a distributing stocker mechanism for placing the plurality of pallets in the magazine onto a carrier; a carrier transporting mechanism for transporting the carrier into a test station in a constant temperature room and transporting the carrier after to outside the constant temperature room; and a recovery stocker mechanism for recovering the plurality of pallets after test on the carrier into the magazine. Thus, the transporting apparatus with high installing area efficiency and high test efficiency can be fabricated at low production cost.

30 Claims, 27 Drawing Sheets

FIG. 3
(PRIOR ART)
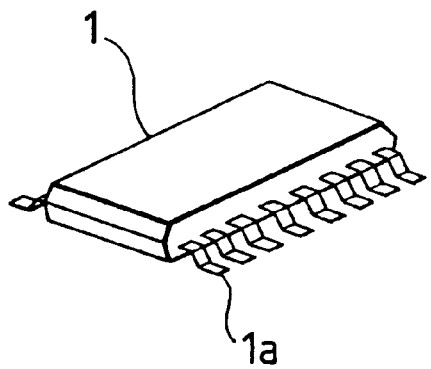
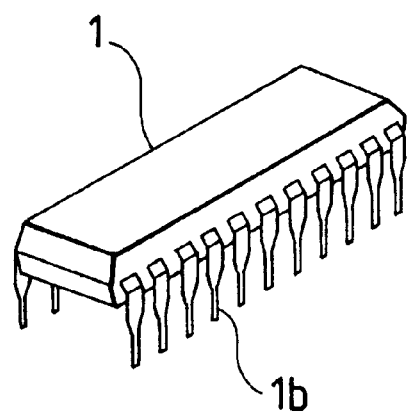
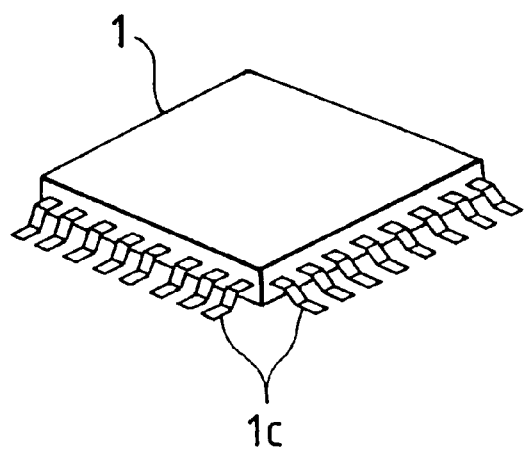

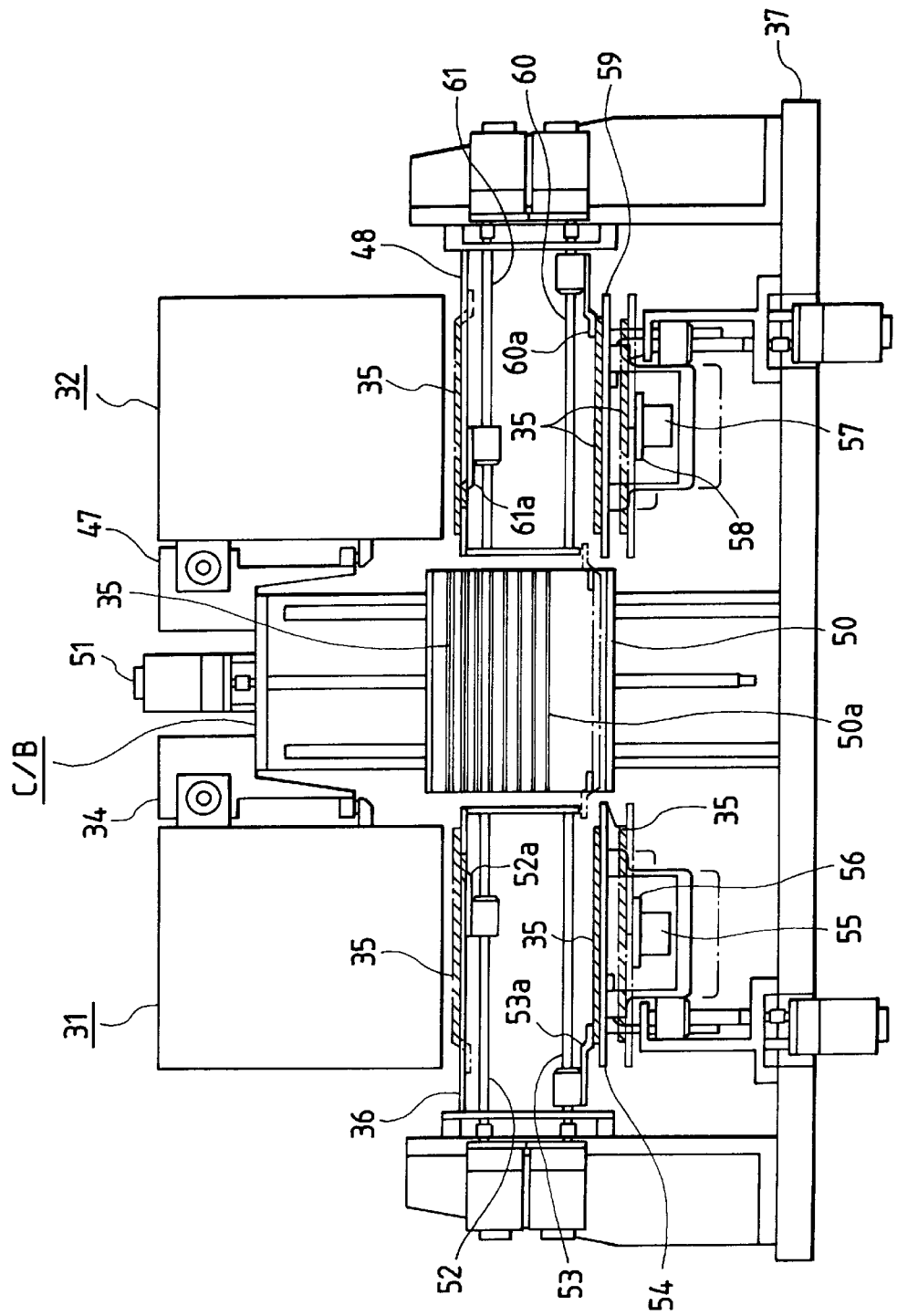

TRANSPORTING APPARATUS FOR SEMICONDUCTOR DEVICE

BACKGROUND OF THE INVENTION

1. Field of the Invention

The present invention relates to an apparatus used in testing the electrical characteristic of semiconductor devices.

2. Description of the Related Art

FIG. 3 shows appearance of three typical semiconductor devices (hereinafter also referred to simply as "device") 1 each equipped with external output terminals 1a, 1b and 1c, respectively.

FIG. 28 schematically shows a conventional testing apparatus for testing a semiconductor device (referred to as a semiconductor testing apparatus). As seen from FIG. 28, the testing apparatus includes a tester body 110, four test heads 111 and four test handlers 116 are shown. Each test handler 116 integrally includes a handler body 113, a loader 114 and an unloader 115. The test head 111 is attached to the handler body 116. The test head 111 incorporates a contact (not shown) in contact with the above device 1 and electrically connected through a cable 112 to a tester body 112 for testing the electric characteristic of the device. The handler body 113 serves to transport the device 1. The loader 114, which is adjacent to the handler body 113, supplies a pallet containing the device 1 before test to the handler body 115. The unloader 114, which is also adjacent to the handler body 113 and arranged on the side opposite to the loader 114, receives the pallet containing the device 1 after test unloaded from the handler body 113.

An explanation will be given of the operation of the semiconductor testing apparatus. When the pallet containing the device before test is cast into the loader 114, it is supplied into the handler body 113 therefrom. The device 1 supplied into the handler body 113 and housed in the pallet is pushed up so that the external output terminal and the contact housed in the test head 111 are brought into contact with each other. In this state, the tester body 110 tests the device with respect to its various electric items. Upon completion of the test, the device 1 is housed in the pallet, discharged from the handler body 113 and housed in the unloader 15.

Because of the structure described above, the above conventional semiconductor testing apparatus has the following defects. An large installing area is needed because of the test handler 116 provided for the test head 111 connected to the tester body 110. In addition, since the test handler 116 necessarily requires the loader 114 for supplying the pallet containing the device before test into the handler body 113, the unloader 115 for housing the device 1 after test discharged from the handler body 113 and a controller therefor, the semiconductor testing apparatus is very expensive.

Further, since the tester body 110 is expensive, its availability factor must be enhanced. This required the time and effort of equally arranging the pallets each containing the device and also casting the pallet into the test handler 116 so that the operation of each of the test handlers 116 terminates at substantially the same timing. Further, the test handlers 116, which are individual from each other, require the individual supply/discharge of the pallet and their running. This results in poor test efficiency.

SUMMARY OF THE INVENTION

An object of the present invention is to provide an transportation apparatus used in testing semiconductor devices which is high in installing area efficiency, low in production cost and high in test efficiency.

In order to attain the above object, in accordance with the present invention, there is provided a transporting apparatus used in testing a plurality of semiconductor devices, comprising: a magazine in which a plurality of pallets are stacked in plural stages, each pallet with a plurality of semiconductor device placed thereon; a distributing stocker mechanism for replacing said plurality of pallets housed in the magazine in a distributing stocker and placing some of the pallets from the distributing stocker onto a carrier; a test station provided within a constant temperature room for testing said semiconductor devices on the pallets carried on the carrier; a carrier transporting mechanism including an IN side carrier transporting mechanism for transporting the carrier with said pallets thereon to said test station and an OUT side carrier transporting mechanism for transporting said carrier after test to outside said constant temperature room; and a recovery stocker mechanism for replacing said plurality of pallets after test on said carrier into a recovery stocker and stacking the pallets from said recovery stocker into said magazine. In such a configuration, a pallets each with semiconductor devices received thereon are housed in a magazine, the pallets taken out from the magazine and carried on the carrier are supplied to the test station, and after test are recovered. For this reason, the transporting apparatus with high efficiency of installing area, supply/recovery operation and running can be provided. Further, since the pallets each with a plurality of devices carried thereon are transported to the test station, a large number of semiconductor devices can be transported and tested simultaneously, thus enhancing the test efficiency.

Preferably, the transporting apparatus further comprises a magazine loader for transferring information of the devices before test read from a recording medium to a controller and transporting said magazine to said distributing stocker mechanism; a magazine traverse for transporting said magazine which has become vacant as a result of replacement of the pallets to said recovery stocker; and a magazine unloader for transporting said magazine with the pallets moved from the said recovery stocker and recording a test result of said semiconductor devices on said recording medium. In such a configuration, the efficiency of simultaneous transportation of a large number of semiconductor devices and installing area of the apparatus can be enhanced and the measurement result of semiconductor devices in the magazine can be obtained immediately.

Furthermore, the transporting apparatus comprises a carrier buffer for temporarily holding, in plural stages, said carrier with said pallets before test and after test carried thereon. In this configuration, a large number of carriers can be transported.

Furthermore, the transporting apparatus comprises a carrier buffer for temporarily holding, in plural stages, said carrier with said pallets before test, said carrier buffer being installed in said constant temperature room. In this configuration, immediately after the carrier is transported to the test station, the test of the devices can be started immediately. For this reason, the transporting apparatus is not required to consider the time taken to elevate the temperature of the semiconductor devices to a prescribed temperature.

Furthermore, the transporting apparatus comprises a carrier buffer for temporarily holding, in plural stages, said carrier with said pallets placed after test, said carrier buffer being installed in said constant temperature room. In this configuration, the carrier transported from the test station can be taken out in a short time, thus preventing condensation.

Furthermore, said carrier transporting mechanism is installed within said constant temperature room. In this configuration, the carrier can be transported to the front of the test head while the test is being executed so that it can be on standby with the devices whose temperature has been elevated to that of the constant temperature room. The loss time in elevation of the temperature and transportation can be removed to enhance the test efficiency.

Furthermore, said carrier transporting mechanism is installed outside said constant temperature room. In this configuration, the state of the devices passing the transporting mechanism is recognized and the transporting mechanism can be easily verified.

Furthermore, the transporting apparatus comprises a plurality of units of constant temperature rooms each having said test station, and said carrier is supplied into or discharged from each of said test stations by said carrier transporting mechanism. In this configuration, the test time of the semiconductor devices having a large capacity can be shortened.

Furthermore, the transporting apparatus further comprises a pallet pushing up unit A which moves from an opening of the lower face of said magazine transferred to below said distributing stocker thereby to lift said pallets into said distributing stocker; said distributing stocker serving to hold the pallets lifted, separate these pallets one by one from the lowest pallet and lift the separated pallet; and a distributing stocker moving mechanism for moving said distributing stocker to align the pallets on said IN side carrier stand.

In addition, the transporting apparatus further comprising said recovery stocker into which the pallets aligned on said carrier on the OUT side carrier stand are successively stacked, and a pallet push-up unit B which moves from an opening of the lower face of a vacant magazine moved to below said distributing stocker thereby to lift said pallets within said recovery stocker and thereafter descend when a pallet holding mechanism of said recovery stocker is released, thereby housing said pallets into the magazine. In such a configuration, the distributing stocker and recovery stocker can be simply structured so that the efficiency of the installing area can be enhanced.

Furthermore, in said distributing stocker or said recovery stocker, a weight in contact the pallets housed in said stocker is provided. It is possible to prevent the devices from extruding from the receiving grooves of the pallet.

Furthermore, the transporting apparatus comprises means for detecting the presence or absence of each of the semiconductor devices on said carrier on said IN side carrier stand; and means for detecting the presence or absence of each of the semiconductor devices on said carrier on said OUT side carrier stand, whereby detecting results are compared with each other. This makes it possible to find the abnormality in the transporting apparatus quickly.

Preferably, the transporting apparatus used in testing semiconductor devices, comprises a plurality of pallets on each of which a plurality of semiconductor devices are placed at prescribed positions where openings are provided; a carrier with the plurality of pallets are located and through-holes; a die set having a positioner for positioning and pushing up the semiconductor devices; and a test head having contactors for test, wherein in test of the semiconductor devices, the positioner of the said die set push up said semiconductor devices through said openings of the carrier and the through-holes of the pallet so that the external terminals are connected to the contactors of said test head. Thus, a plurality of test handlers which was required in the prior art can be collected into a single transporting apparatus.

Furthermore, a transporting apparatus used in testing semiconductor devices comprises a test board having contactors for test to be brought into contact with external terminals of semiconductor devices; a test head for removably supporting said test board having connectors to be brought into contact with the said contactors; a test head supporting mechanism for supporting said test head; a test head lifting mechanism for ascending and descending said test head supporting mechanism to take out said test head from a constant temperature room, wherein said test head is tiltable for said test head supporting mechanism. In this configuration, the test head can be elevated to be exposed outside the constant temperature room so that the check or replacement of the test board can be easily made. The test head can be easily tilted to check the test head or check the inside of the constant temperature room.

The above and other objects and features of the present invention will be more apparent from the following description taken in conjunction with the accompanying drawings.

BRIEF DESCRIPTION OF THE DRAWINGS

FIG. 3 is an appearance view of typical semiconductor devices;

FIG. 14 is a front view of the carrier buffer C/B according to the first embodiment;

DETAILED DESCRIPTION OF THE PREFERRED EMBODIMENTS

First Embodiment

Figure 1:
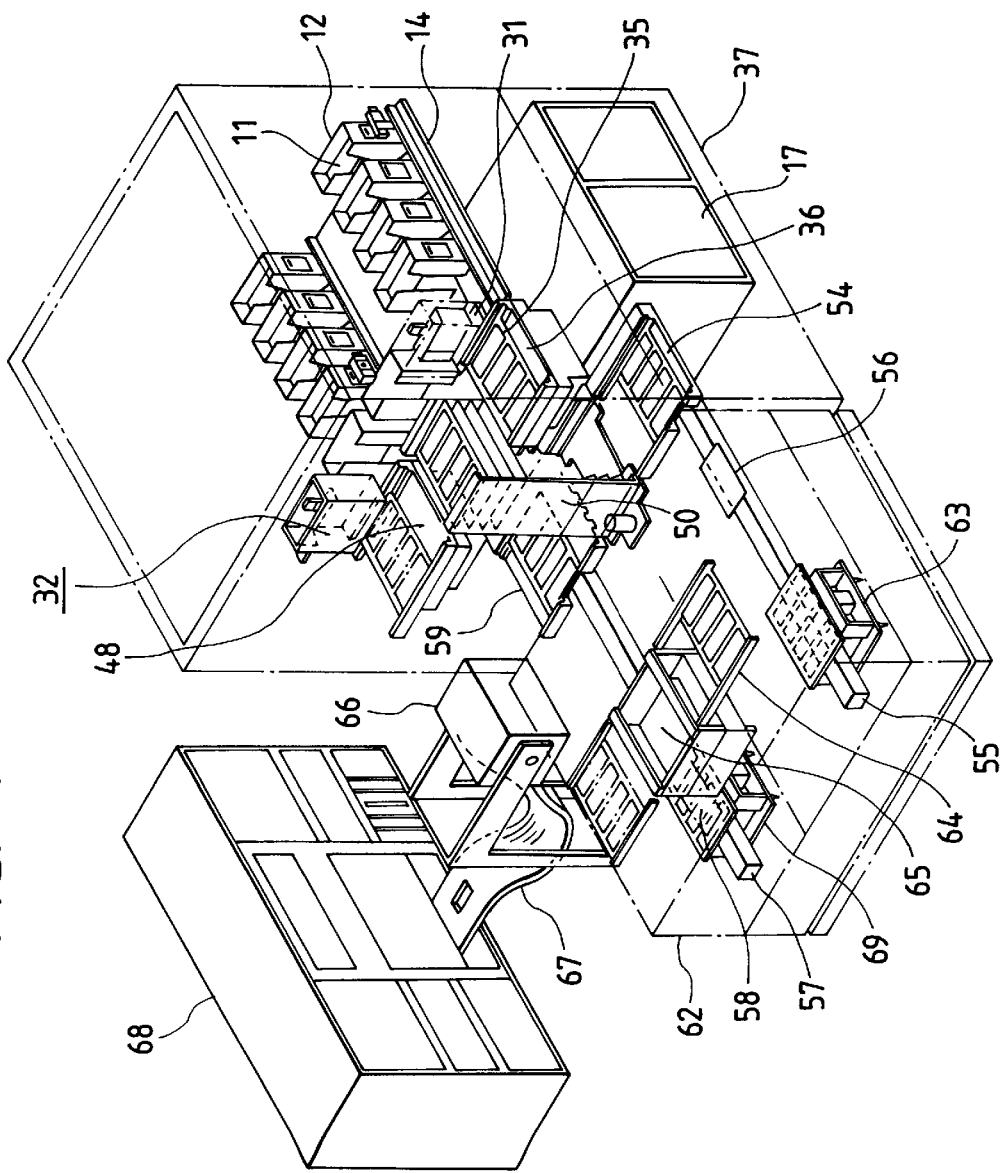
FIG. 1 is a perspective view of the entire structure of a transporting apparatus used in testing semiconductor devices according to a first embodiment of the present invention.
Figure 2:
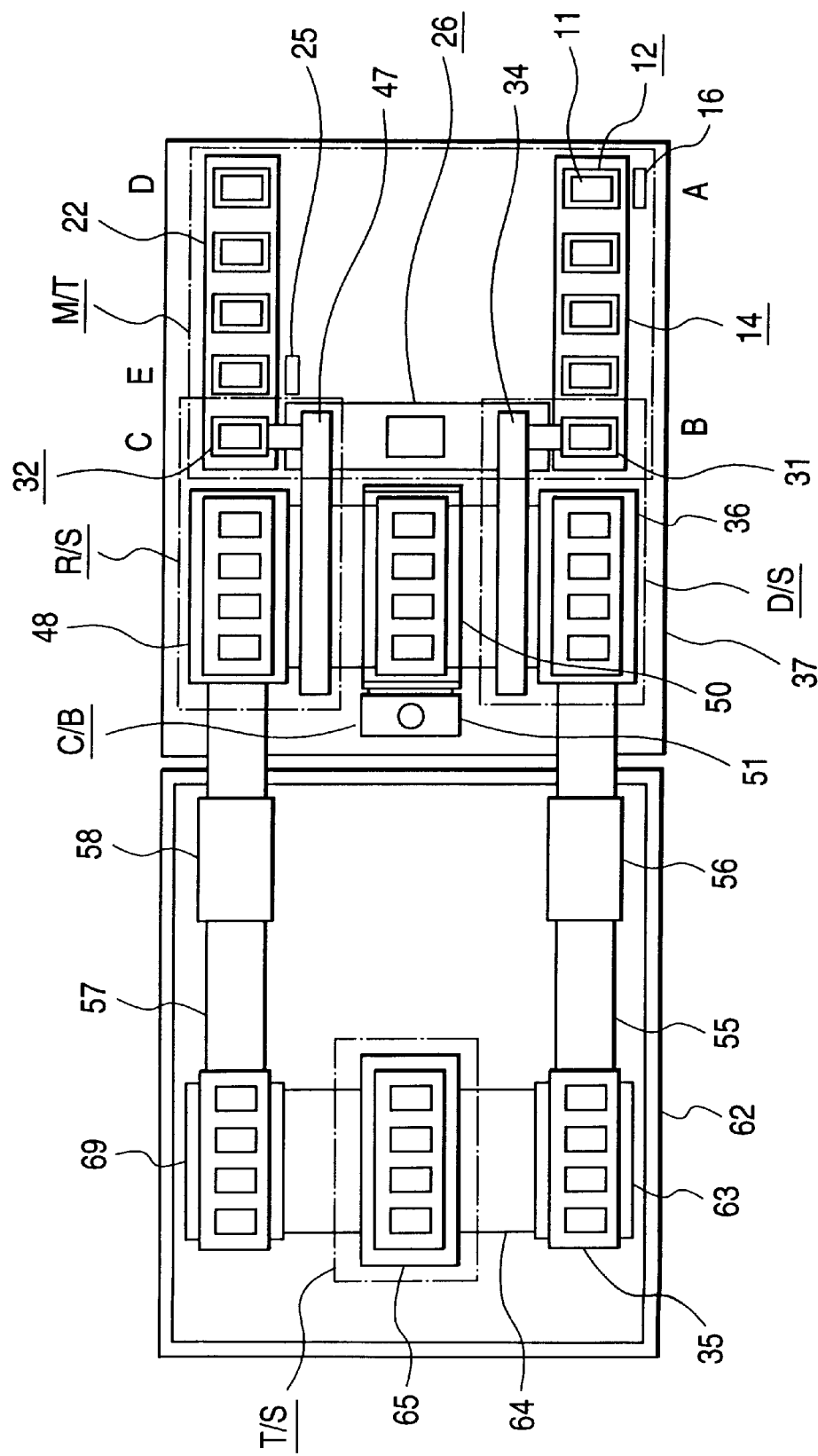
FIG. 2 is a schematic plan view of the transporting apparatus according to the first embodiment.

Referring to FIGS. 1 and 2, an explanation will be given of the outline of the first embodiment. FIG. 1 is a perspective view of the entire structure of a transporting apparatus used in testing semiconductor devices according to a first embodiment of the present invention. FIG. 2 is a schematic plan view of FIG. 1.

As seen from FIG. 1, the transporting apparatus according to the first embodiment includes magazines 12 in which a plurality of pallet 11 are stacked, each pallets 11 on which a plurality of semiconductor devices (hereinafter referred to as 'devices') are aligned. The magazine includes an IC card 13 attached on its side for storing the information on the devices. The magazine 12 is transported from a supplying position A to a distributing position B by a magazine loader 14. The information stored in the IC card 13 is transferred to a read control section 17 by a read device 16.

The pallets 11 within the magazines 12 transported to the distributing place B are lifted into a distributing stocker and held there. They are separated one by one in order from the lowest pallet in the distributing stocker 31 and aligned on a carrier 35 on a stand 36 on the side of IN.

The carrier 35 including the pallets 11 aligned therein is once held in a carrier buffer 50 having plural stages of shelves. The carrier 35 is thereafter taken out from the carrier buffer 50 and placed on a shuttle 56 on the IN side. The carrier 35 is transported into a constant temperature room 62 by a shuttle transporting mechanism 55 on the IN side, and transferred to a third carrier moving mechanism 64 by a carrier lifting mechanism 63. The carrier 35 is further moved to a test station T/S by the third carrier moving mechanism 64. The device housed in the pallet 11 is pushed up by a die set 65 so that it is tested by a test head 66.

Upon completion of test, the carrier 35 housing the pallets 11 is moved to a carrier lifting mechanism 69 by the third carrier moving mechanism 64, and further moved to a shuttle transporting mechanism 57 on the OUT side located in parallel and oppositely to the shuttle transporting mechanism 55 on the IN side with respect to the test station T/S.

The carrier 35 taken out from the constant temperature room 62 by the OUT side shuttle 58 is once held in the carrier buffer 50 like the case of the IN side and pulled out onto a carrier stand 48 on the OUT side. The pallets 11 aligned on the carrier 35 on the stand of the OUT side are successively stacked by the recovery stocker 32 to reach the number corresponding to one magazine.

On the other hand, the magazine 12 which has moved the pallets 11 into the distributive stocker 31 to become vacant is moved to the lower part of the recovery stocker 32. The pallets 11 are replaced into the vacant magazine. The magazine 12 which has recovered the pallets at the transfer position is moved by the magazine unloader 22. When the magazine 12 is transported from the replacing position C to the take-out position, the test result of the devices stored in the control section 17 is stored in the IC card 13 by an IC card write device 25.

As described above, in the transporting apparatus according to this embodiment, the installing area before and after test can be greatly reduced by preparing the magazine in which pallets 11 each having plural semiconductor devices are stacked. In addition, the installing efficiency can be greatly enhanced by provision of the magazine loader 14 for transporting the magazine 12 to the distributive stocker mechanism D/S, a magazine traverse 29 for transporting the vacant magazine to the recovery stocker mechanism R/S, a magazine unloader 22 for transporting the magazine having recovered the pallets after test and the magazine transporting mechanism M/T formed in U-shape or the like. The installing efficiency can be further enhanced by provision of the distributive stocker mechanism D/S for replacing the pallets 11 within the magazine into the distribution stocker 31 and placing the plural pallets on the carrier 35, and the recovery stocker mechanism R/S for replacing the pallets after test on the carrier 35 into the recovery stocker 32 and housed in the magazine therefrom. Further, this embodiment includes a carrier transporting mechanism in a circular loop composed of the test station T/S arranged in the constant temperature room 62 for collectively testing the devices on each of the pallets placed on the carrier 35, IN side carrier transporting mechanism for transporting the carrier 35 to the test station T/S (IN side shuttle transportation mechanism 55, IN side lifting mechanism 63 and third carrier moving mechanism 64)) and the OUT side carrier transporting mechanism (OUT side shuttle transporting mechanism 57, OUT side shuttle lifting mechanism 69 and third carrier moving mechanism 64).

Now referring to FIGS. 1 to 19, an explanation will be given of the details of the transporting apparatus used in testing semiconductor devices according to the first embodiment.

Figure 4:
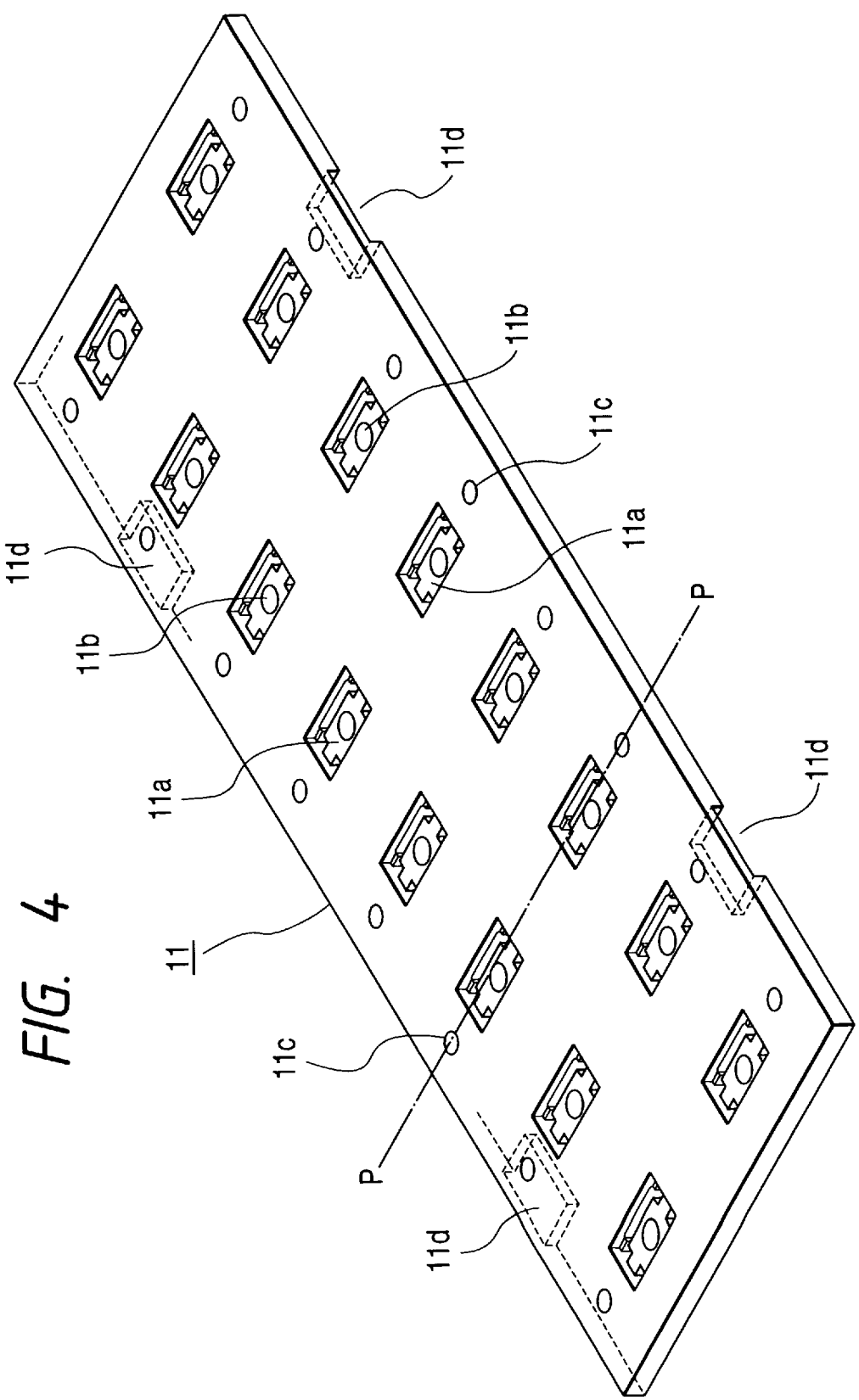
FIG. 4 is a perspective view of a pallet used in the transporting apparatus.

FIG. 3 shows appearance of each of three typical semiconductor devices (hereinafter referred to as "devices"). FIG. 4 shows an example of a pallet on which the devices are located to be used in the transporting apparatus. As seen from FIG. 4, the pallet 11 includes concave areas 11a for housing the devices 1, respectively. Each concave area 11a has a through-hole 11b for pushing up the device 1. At both edges of the pallet, through-holes 11c are formed so that they are coincident with the center line P—P of the concave areas 11a. On both sides of the bottom of the pallet, concave area 11d each having a prescribed width and depth are formed.

Figure 5:
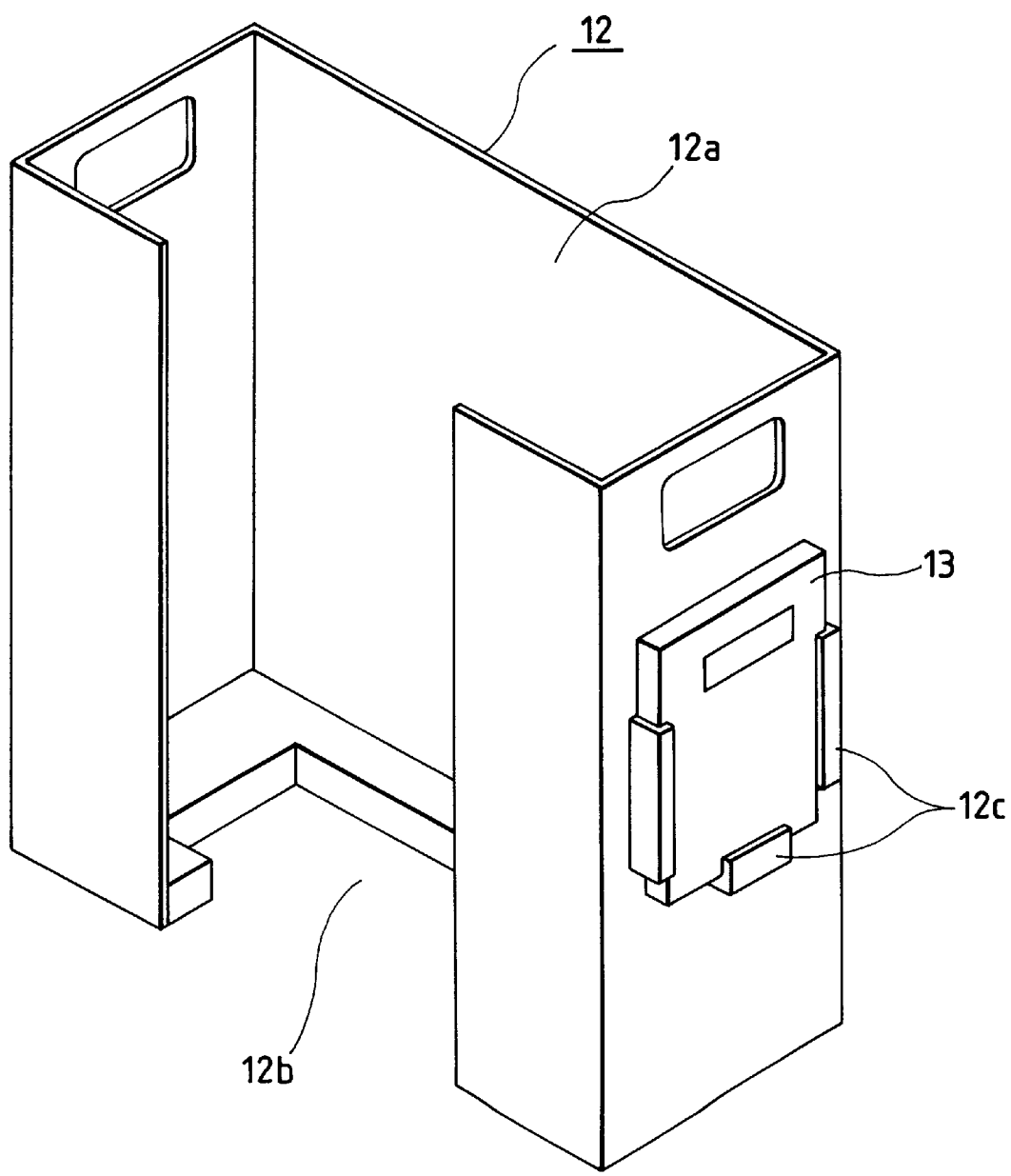
FIG. 5 is a perspective view of a magazine used in the transporting apparatus.

FIG. 5 shows a magazine 12 in which a plurality of pallets are stacked in plural stages. The magazine is used to transport the pallets between transporting steps. At the top thereof, an opening area 12a for loading/unloading the pallets, and at the bottom thereof, an opening area 12b serving as a receiving plane for the pallets and pushing up them. On the side thereof, a pocket 12c for holding an IC card containing the information on the housed devices 1 before test. The IC card 13 contains the information such as the kind of the devices, testing steps, number of the housed pallets and the number of the devices in the pallet.

Figure 6:
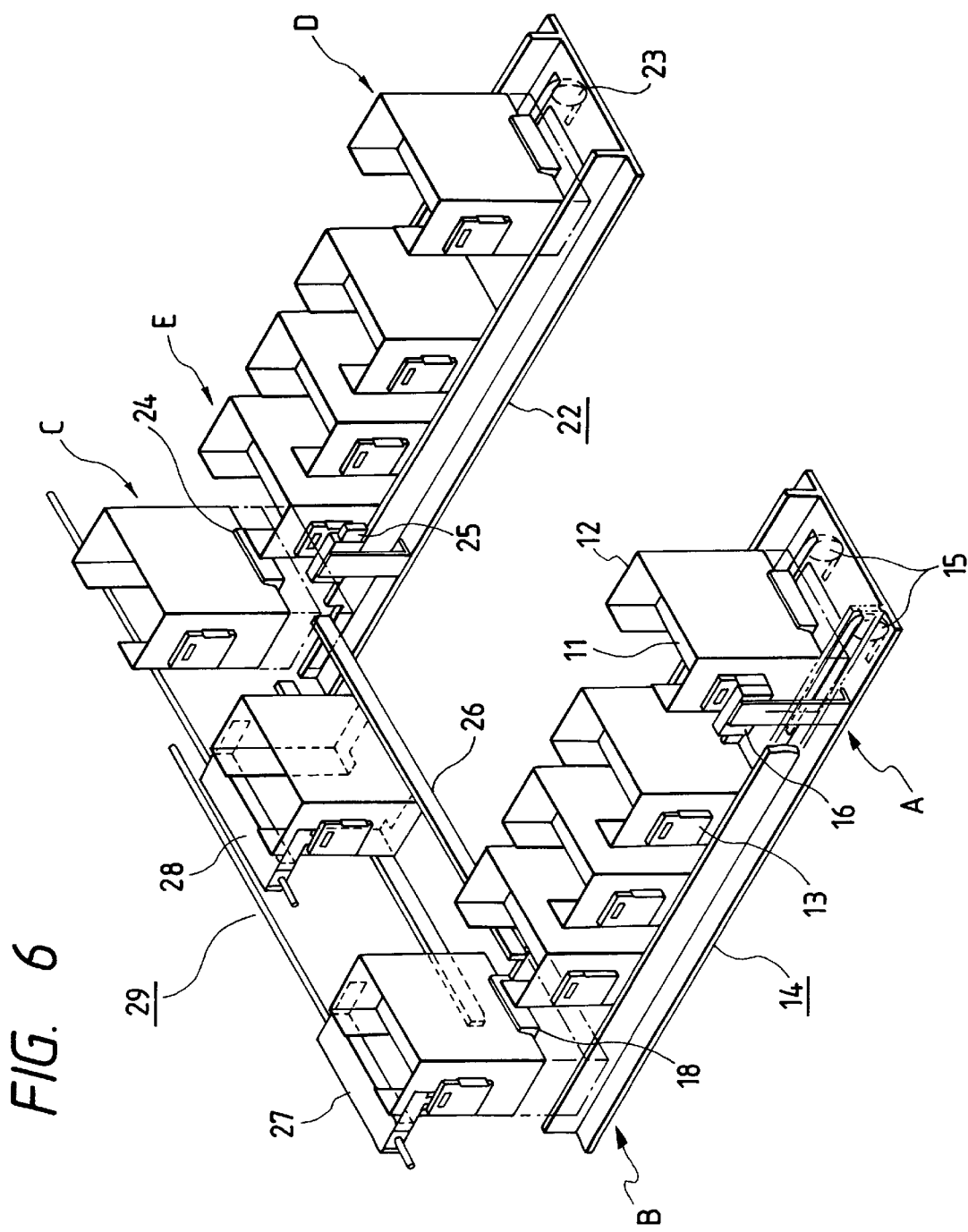
FIG. 6 is a detailed perspective view of a magazine transporting section M/T used in the present invention.
Figure 7:
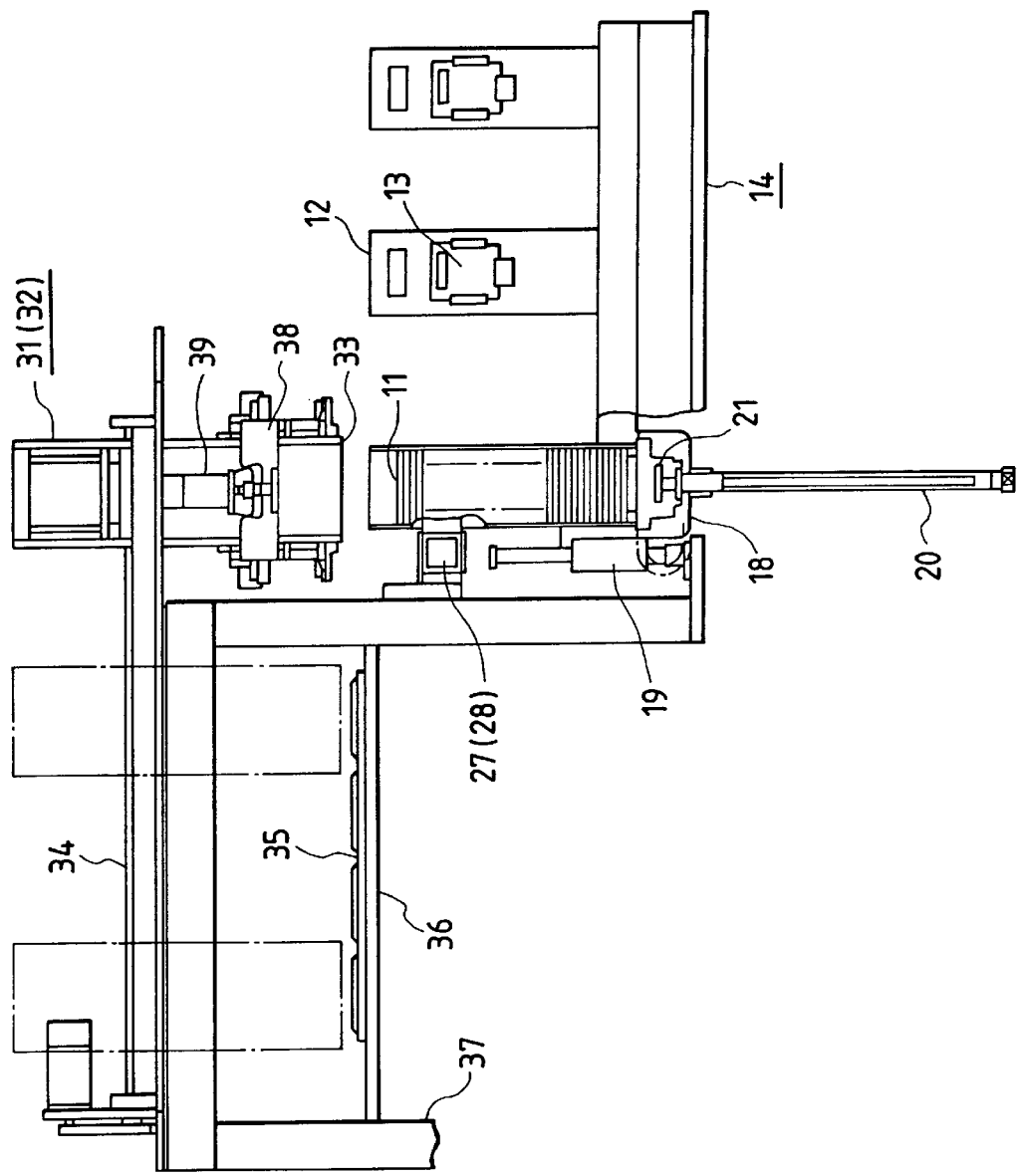
FIG. 7 is a view showing a relationship between the magazine transporting section and a distributive stocker section (recovery stocker section)

FIG. 6 is a detailed perspective view of the magazine transporting mechanism M/T. FIG. 7 shows the relationship between the magazine transporting mechanism M/T and distributing stocker mechanism D/S (recovery stocker mechanism R/S) in their section.

The magazine transporting mechanism M/T includes the magazine loader 14, unloader 22 and the magazine traverse 29 for transferring the magazine 12 which has become vacant to the magazine unloader 22. The magazine loader, generally 14, includes a first magazine transporting device 15 which may be a belt or chain conveyer. The magazine loader 14 serves to transport the magazine 12 set at a supplying position A to the replacing position B at pre-scribed time intervals. At the magazine supplying position A, the IC card reader 16 is installed. The IC card reader 16, when it opposes the IC card 13 attached to the magazine 12, reads the information on the device 1 stored in the IC card 13 by optical communication technology and replace it to the control section 17 shown in FIG. 1. The first magazine lifting plate 18 serves to position and place the magazine 12.

The magazine lifting plate 18 is vertically driven by the first magazine lifting mechanism 19. A pallet push-up unit A20 is attached to the bottom of the magazine lifting plate 18. A pallet push-up plate 21 is mounted on the tip of the movable portion of the push-up unit 20.

The magazine unloader 22 has the same structure as that of the magazine loader 14. Specifically, the magazine unloader 22 includes a third magazine transporting device 23, a second magazine lifting plate 24, a second magazine lifting mechanism (not shown) and a pallet push-up unit (not shown). The magazine unloader serves to transport the magazine 12 from the replacing position C where the pallet 11 is replaced from the recovery stocker (not shown) 46 into the magazine 12 to the take-out position where the magazine 12 is taken up. The second magazine lifting plate 24 serves to position and place the magazine 12 transported to the transfer position C. The second magazine lifting mechanism (not shown) serves to drive the second magazine lifting plate 24. The pallet push-up unit is attached to the bottom of the second magazine lifting plate 24, and has a pallet push-up plate (not shown) mounted on the tip of its movable portion. At the position E, the IC card writer 25 is installed. The IC card writer 25, when it opposes the IC card 13 attached to the magazine 12, writes the test result of the device 1 stored in the control section 17 by optical communication technology.

The magazine traverse 29 includes the second magazine transporting device 26, first magazine moving mechanism 27 for moving the magazine which has become vacant at the pallet replacing position B to the second magazine transporting mechanism 26 and second magazine moving mechanisms 28 for moving the magazine 12 which has become vacant to the replacing position C.

Figure 8:
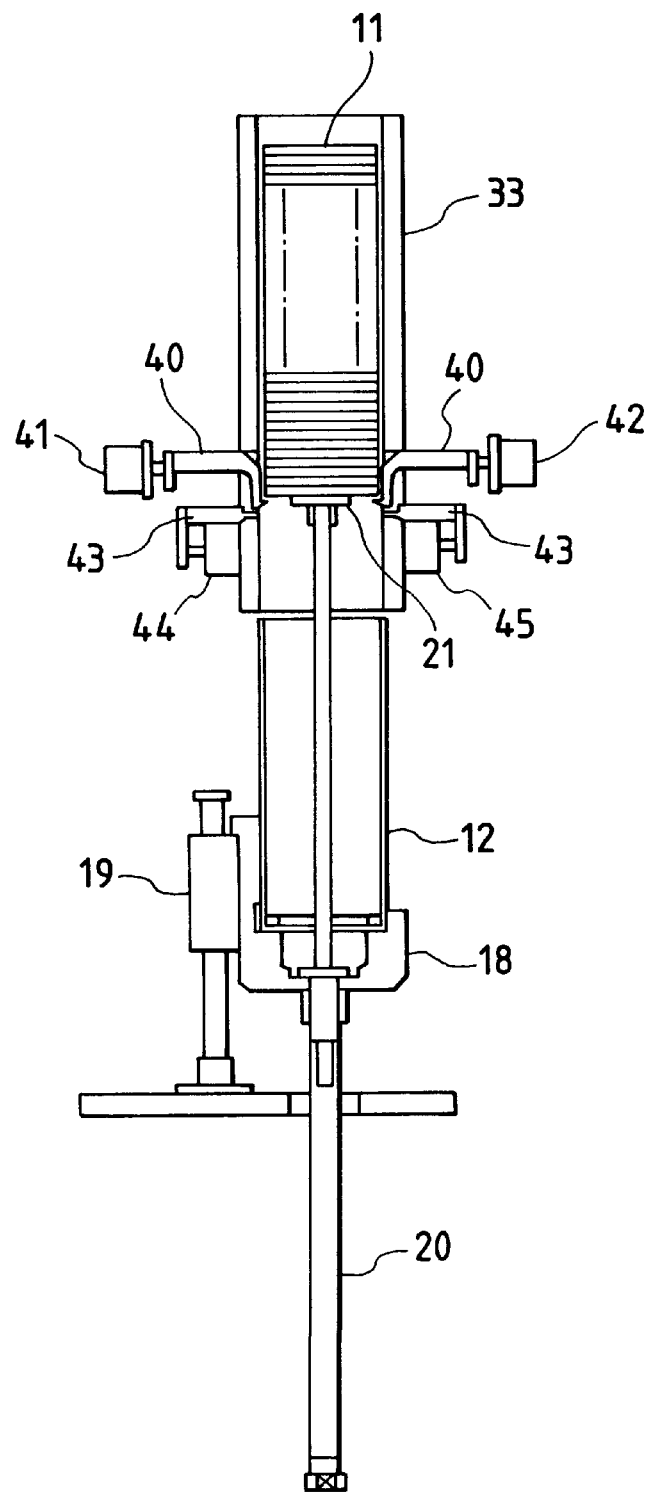
FIG. 8 is a sectional view of the pallet within the distributive stocker in the present invention.
Figure 9:
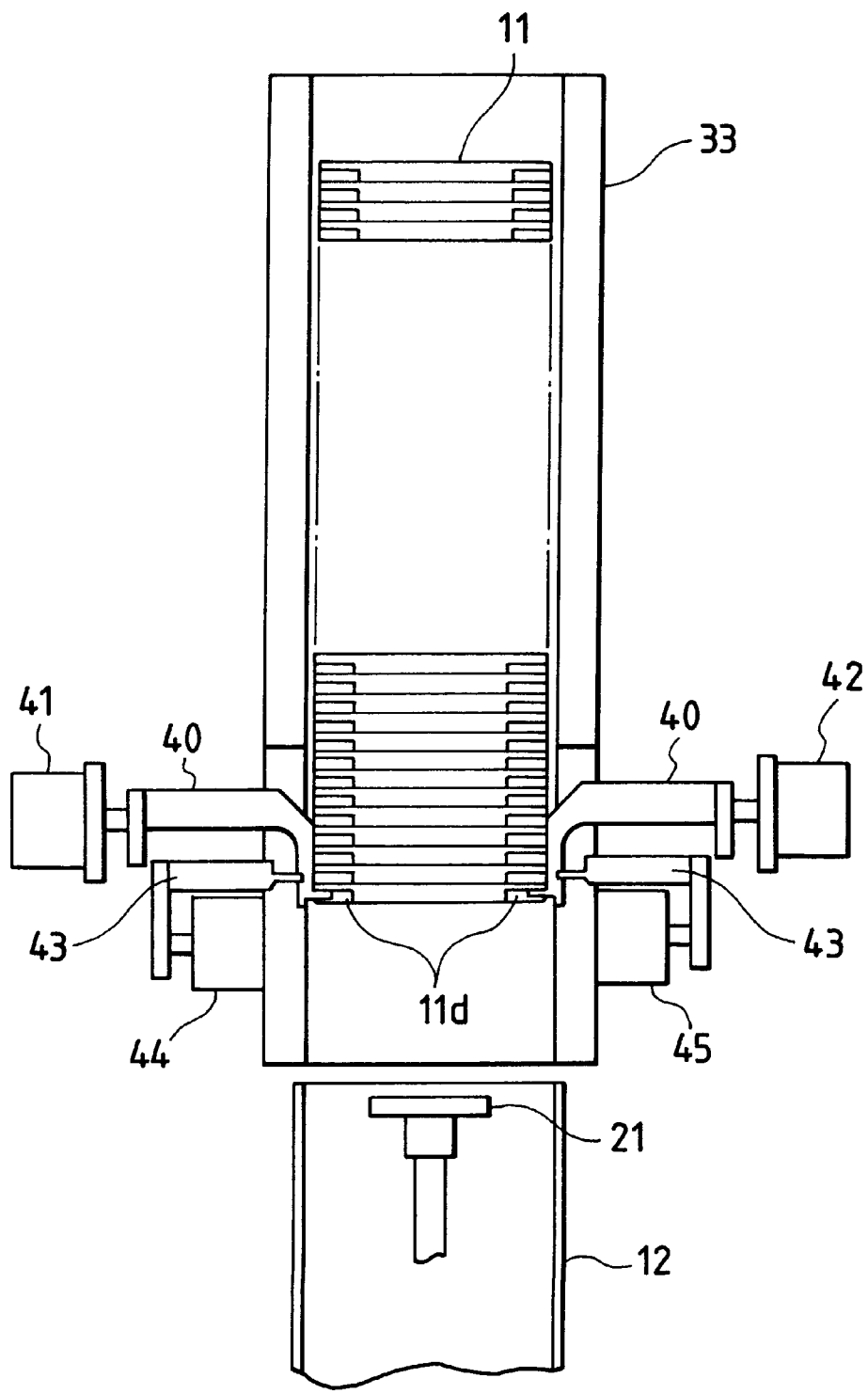
FIG. 9 is a sectional view showing the state where the pallet is supported within the distributive stocker.
Figure 10:
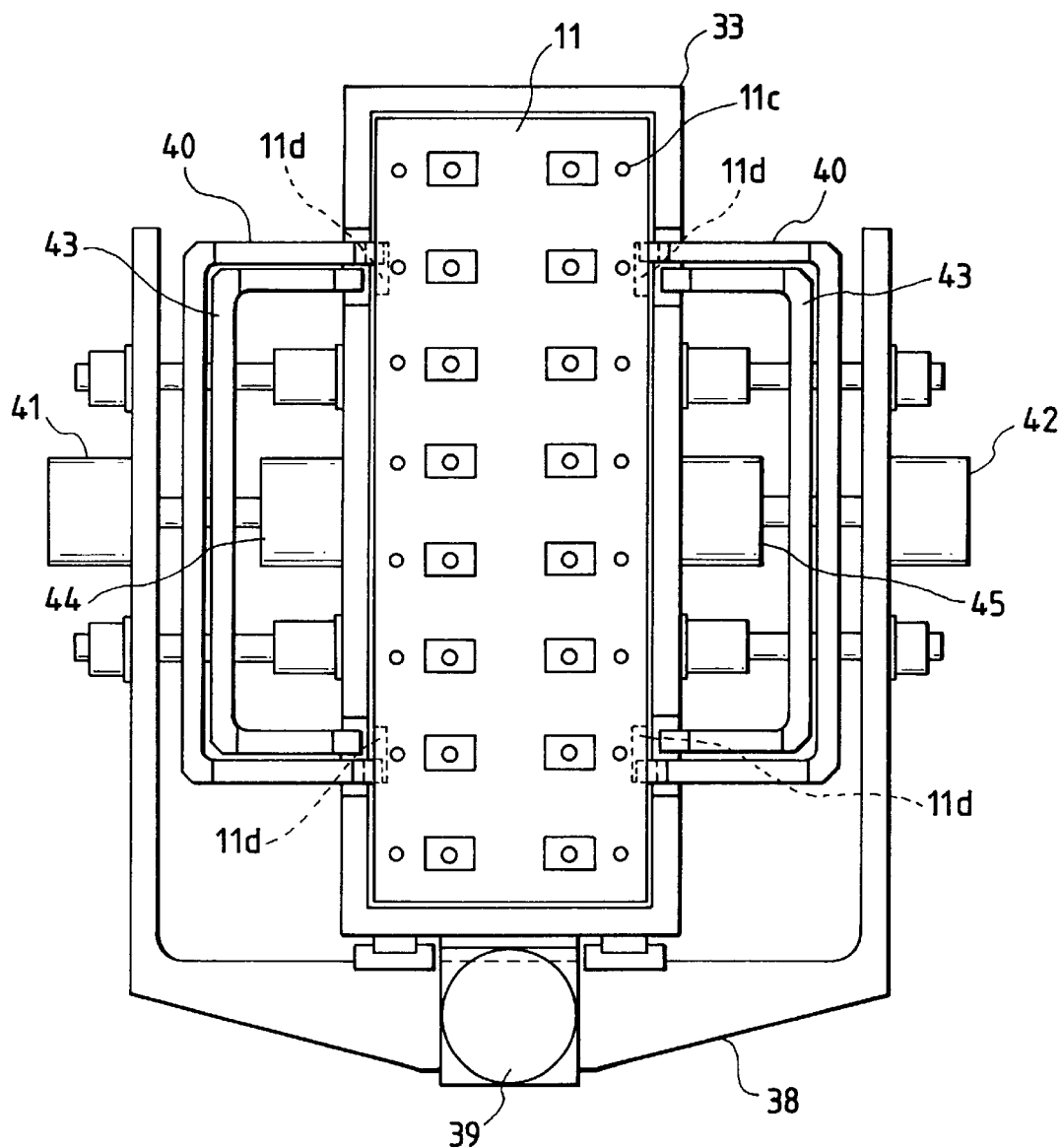
FIG. 10 is a plan view corresponding to FIG. 9.
Figure 11:
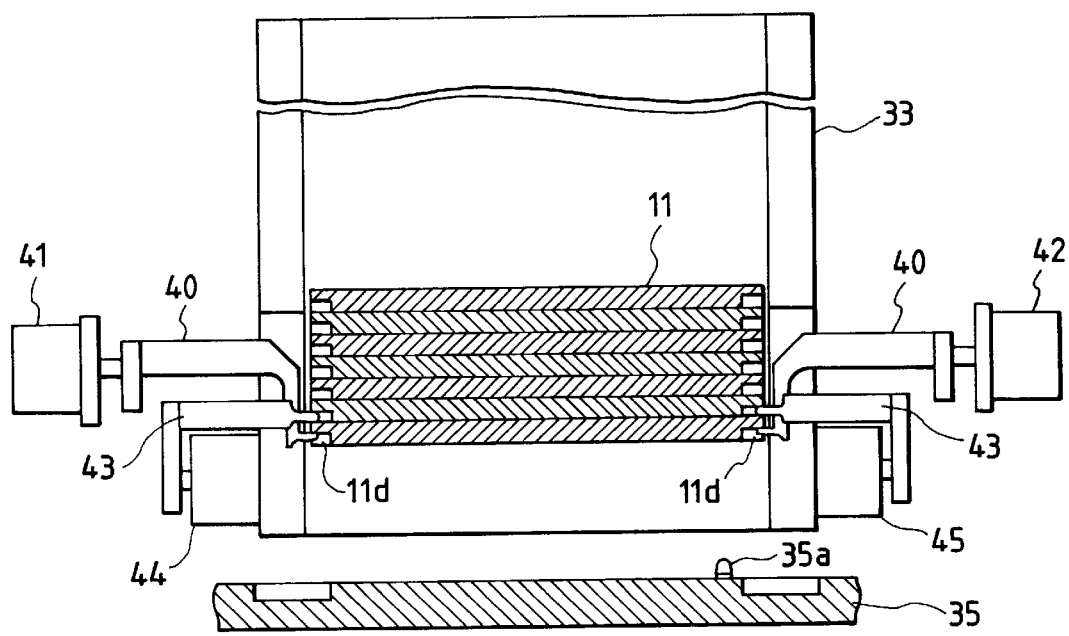
FIG. 11 is a view showing the state where the pallet is separated within the distributive stocker.
Figure 12:
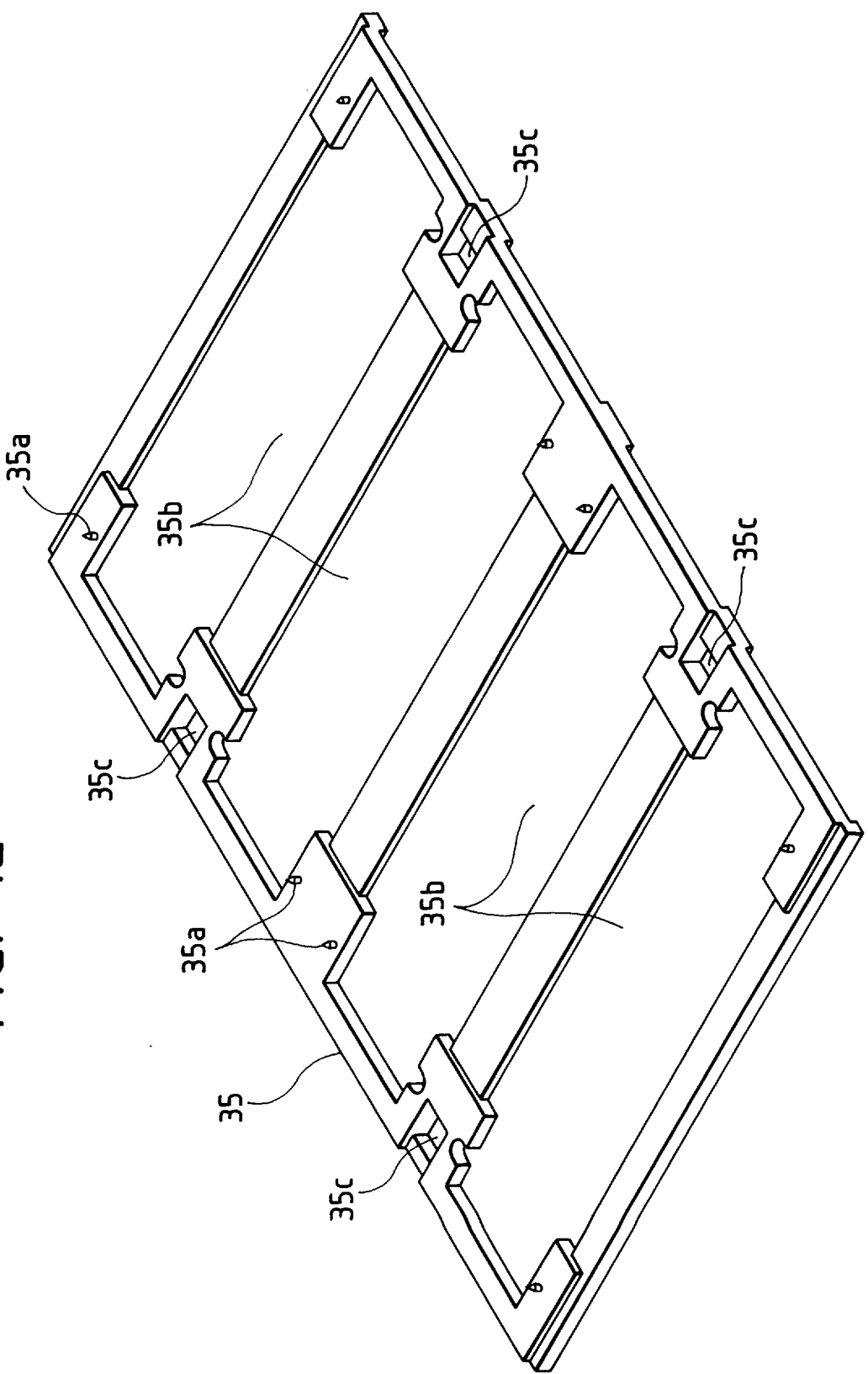
FIG. 12 is a perspective view of the carrier used in the transporting apparatus according to the present invention.
Figure 13:
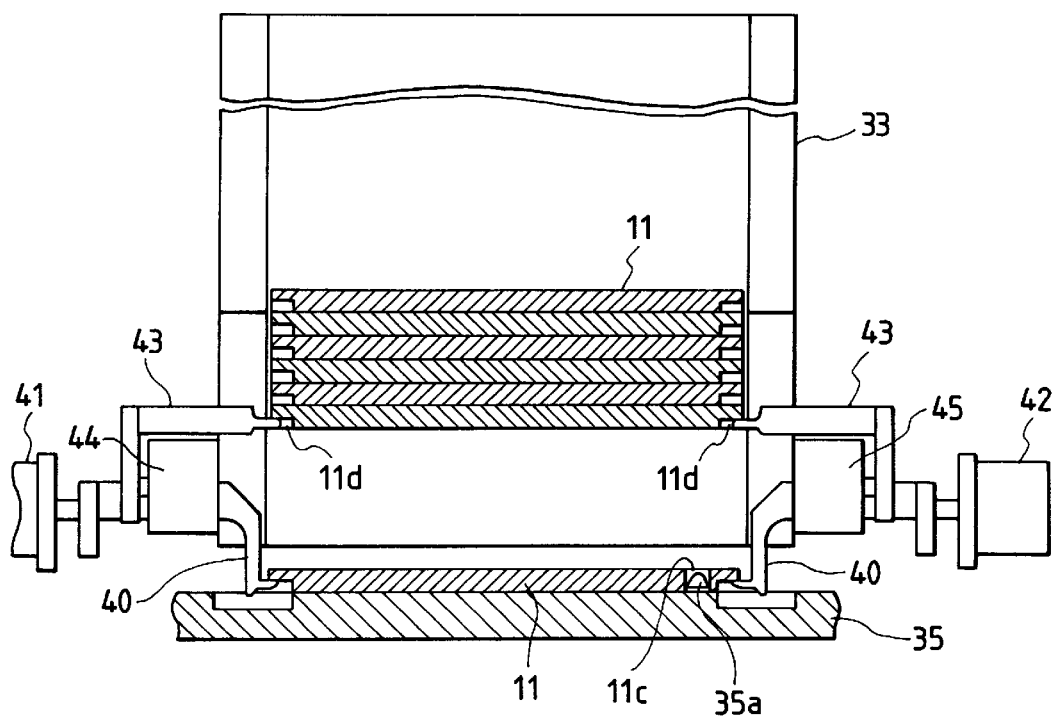
FIG. 13 is a view where the pallet is mounted on a pallet.

The distributing stocker mechanism D/S (distributing stocker 31) and the recovery stocker mechanism R/S (recovery stocker 32), which are symmetrically attached to the carrier buffer C/B (described later), have the same structure. The explanation will be given for the distributing stocker mechanism D/S (distributing stocker 31). FIG. 8 is a side sectional view showing the state where the pallets 11 housed in the magazine has been pushed up into the distributing stocker 33. FIG. 9 is a side sectional view showing the state where the pallets 11 are supported when the pallet push-up plate 21 has ascended. FIG. 10 is a plane sectional view of FIG. 9. FIG. 11 is a side sectional view showing the state where the pallets 11 are separated within the distributing stocker 33. FIG. 12 is a perspective view of the carrier 35. FIG. 13 is a side sectional view showing the state where the pallets 11 are loaded.

As seen from FIG. 7, the distributing stocker mechanism D/S includes a distributing stocker 31 for holding the pallets 11 taken out from the magazine 12, distributing stocker moving mechanism 34 for moving the distributing stocker 31 horizontally, carrier 35 on which the pallets 11 in the distributing stocker 31 are aligned and IN side carrier stand 36 attached to the loader stand 37.

The distributing stocker 31 includes a cylindrical distributing stocker 33 for housing the pallets 11, a pallet loading mechanism 38 for separating the pallets within the distributing stocker 33 one by one to load them on the carrier 35 and a two-stage stroke cylinder 39 attached to the distributing stocker 33 for ascending and descending the pallet loading mechanism 38.

FIG. 8 shows the state where the stroke of the two step stroke cylinder 39 is zero, FIG. 11 shows the state where it has been stroked by one step, and FIG. 13 shows the state where it has been stroked by two steps.

The pallet loading mechanism 38 supports a pair of first pieces 40 which move to and from a pair of grooves 11d on both sides of the lowest pallet 11 in the distributing stocker 33. The first pieces 40 are moved by cylinders 41 and 42.

The pallet loading mechanism 38 also supports a pair of second pieces 43 which move to and from a pair of grooves 11d on both sides of the second pallet 11 from the lowest one in the distributing stocker 33. The second pieces 43 are moved by cylinders 44 and 45.

As seen from FIG. 12, pallet positioning pins 35a are pounded into the carrier 35. The pallet 11 will be located on the carrier 35 in such a manner that the through-holes 11c formed on the side edges of the pallet 11 are engaged with the pallet positioning pins 35a. The carrier 35 includes opening areas 35b through which the devices 1 housed in the grooves 11a of the pallet 11 by a die set described later and through-holes 35c used for its loading/unloading for the carrier buffer 50 described later.

The recovery stocker 32, which is supported by a recovery stocker moving mechanism 47 (FIG. 14), moves horizontally to recover the pallets 11, one by one, loaded on the carrier 35 pulled out from the carrier buffer 50 to the OUT side carrier stand 48.

FIG. 14 is a front view of the carrier buffer unit C/B. As seen from FIG. 14, the carrier buffer 50 includes plural stages of shelves 50a for temporarily holding the carrier 35. A carrier buffer lifting mechanism 51, which serves to ascend and descend the carrier buffer 50, is attached to a loader stand 37. A first carrier moving mechanism 52, which is attached to the lower part of the IN side carrier stand 36, moves carrier moving pins 52a so as to be engaged with the through-holes 35c made in the carrier 35 so that the carrier 35 is replaced from the IN side carrier stand 36 to the carrier buffer 50.

A second carrier moving mechanism 53, which has the same structure as that of the first carrier moving mechanism, is provided below it. The second carrier moving mechanism 53 moves carrier moving pins 53a so as to be engaged with the through-holes 35c made in the carrier 35 so that the carrier 35 housed in the carrier buffer 50 is positioned and located on the IN side lift stand 54.

The IN side shuttle transporting mechanism 55 serves to transport the carrier 35, which has been carried on the IN side shuttle 56 by the fall of the IN side lift stage 54, from the IN side lift stage 54 to the IN side carrier lift mechanism 63 provided in the constant temperature room 62 described later.

The OUT side shuttle transporting mechanism 57 serves to transport the carrier 35 after test, which has been carried on the OUT side shuttle 56 by the OUT side carrier lift mechanism 69 provided in the constant room 62 described later, to the OUT side lift stage 59.

A fourth carrier moving mechanism 60, which has the same structure as that of the first carrier moving mechanism 52, moves carrier moving pins 60a so as to be engaged with the through-holes 35c made in the carrier 35 so that the carrier 35 positioned and located on the IN side lift stage 59 is held in the carrier buffer 50.

A fifth carrier moving mechanism 61, which has the same structure as that of the first carrier moving mechanism, is provided above it. The fifth carrier moving mechanism 61 moves carrier moving pins 61a so as to be engaged with the through-holes 35c made in the carrier 35 so that the carrier 35 housed in the carrier buffer 50 is transferred to the OUT side carrier stand 48.

Now referring to FIGS. 1 and 2, an explanation will be given of the internal structure of the constant temperature room 62. The constant temperature room 62 is controlled so that the temperature within the room is kept constant by a heat exchanger (not shown). The carrier 35 is transported to above the IN side shuttle lift mechanism 63 within the constant temperature room 62 by the IN side shuttle 56. The IN side shuttle transporting mechanism 55 is provided with a shatter at its boundary entering the constant temperature room. The shatter is closed except when the IN side shuttle 56 is moved, thereby keeping constant the temperature within the room.

The carrier 35 is positioned by the rise of the IN side shuttle lift mechanism 63, and carried on an IN side open/close rail of the third carrier transporting mechanism 64 perpendicular to the IN side shuttle transporting mechanism 55. When the IN side carrier lift mechanism rises, the rail opens downward at a fulcrum of its upper point, whereas when it has risen to a prescribed position, the rail closes to receive the carrier 35. Such an open/close rail is provided on an opposite OUT side. The third carrier moving mechanism 64 serves to transport the carrier 35 from the open/close rail on the IN side to the test station T/S, and further to the open/close rail on the OUT side.

Figure 15A:
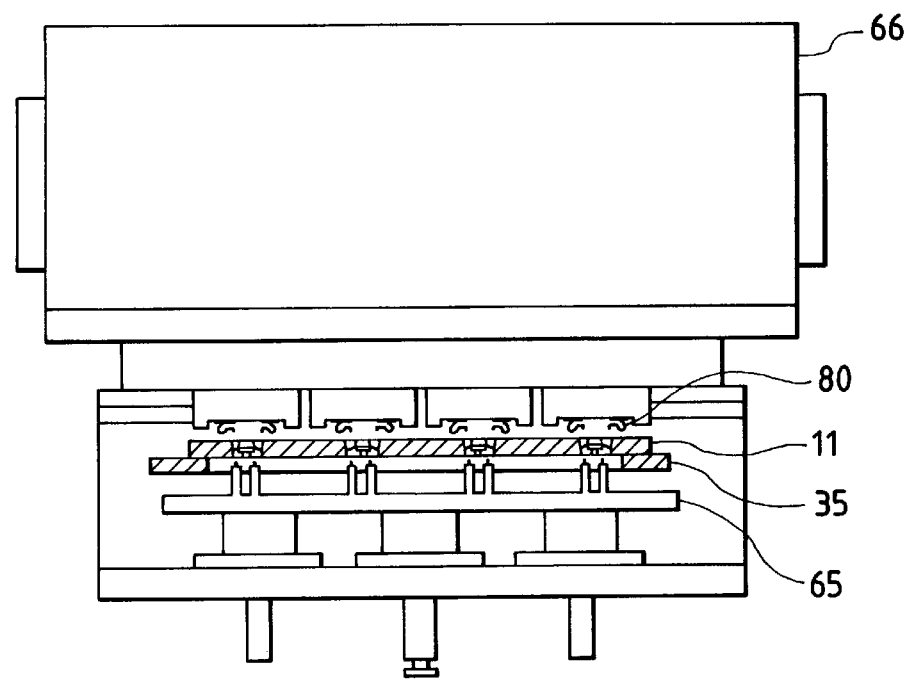
FIGS. 15A and 15B are views showing the state before a semiconductor device is tested by a test head.
Figure 15B:
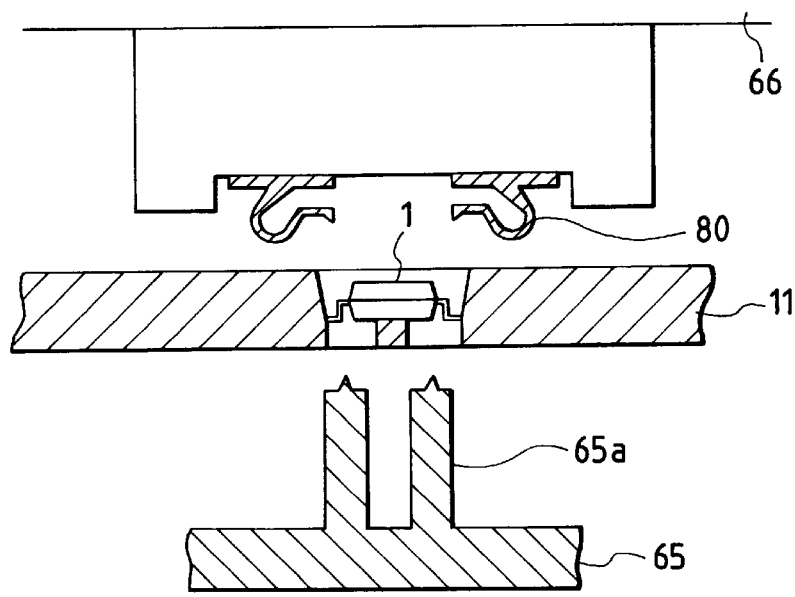
Figure 16A:
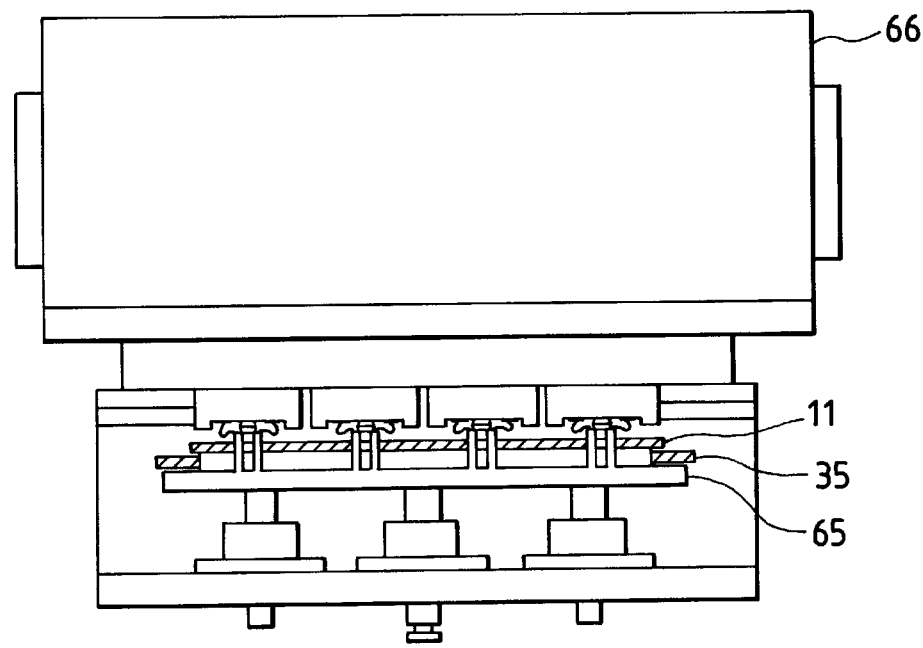
FIGS. 16A and 16B are front views the state where the semiconductor device is being tested by the test head.
Figure 16B:
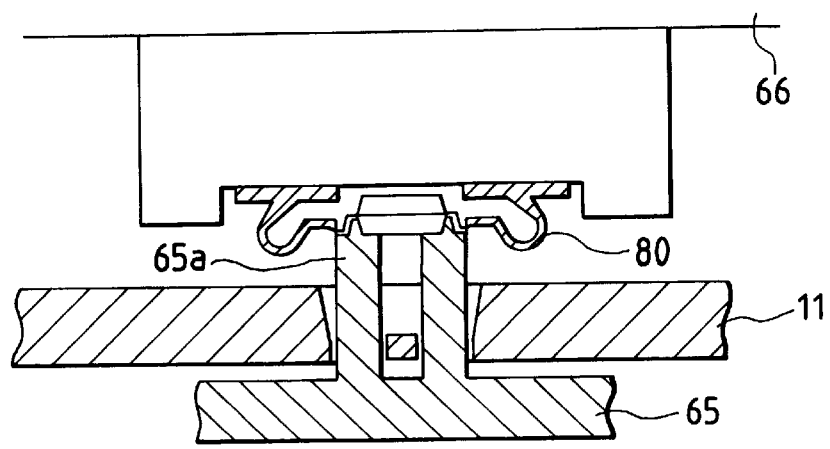

The die set 65 in the test station T/S is located below the third carrier moving mechanism 64 and substantially centrally within the constant temperature room 62. The test head 66 is supported on the constant temperature room 62 and attached to the upper face of the die set 65. The test set 65 includes a positioner 65a (FIG. 15) for pushing up and supporting the device 1. The test head 66 incorporates a contactor 80 electrically connected to a tester body 68 through a cable 67. FIGS. 15 and 16 are a front view and an enlarging view showing the relationship between the test head, device and die-set before and during the test.

The OUT side carrier lift carrier mechanism 69 rises to complete the test and positions the carrier 35 carried on the open/close rail of the third carrier moving mechanism 65. When the open/close rail is opened, the carrier 35 falls to be located on the OUT side shuttle 58.

Figure 17:
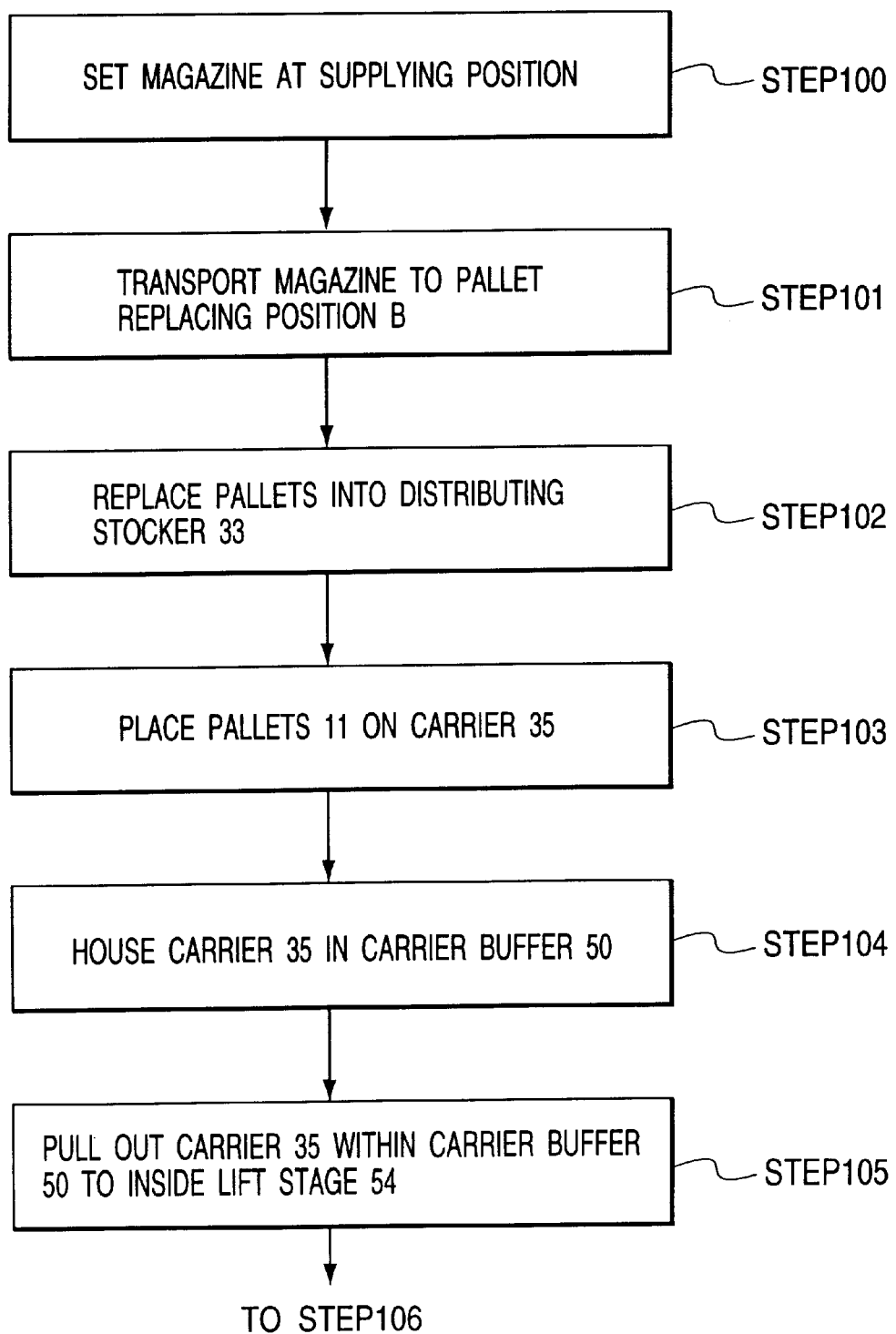
FIGS. 17 to 19 are flowcharts showing the operation in the first embodiment.
Figure 18:
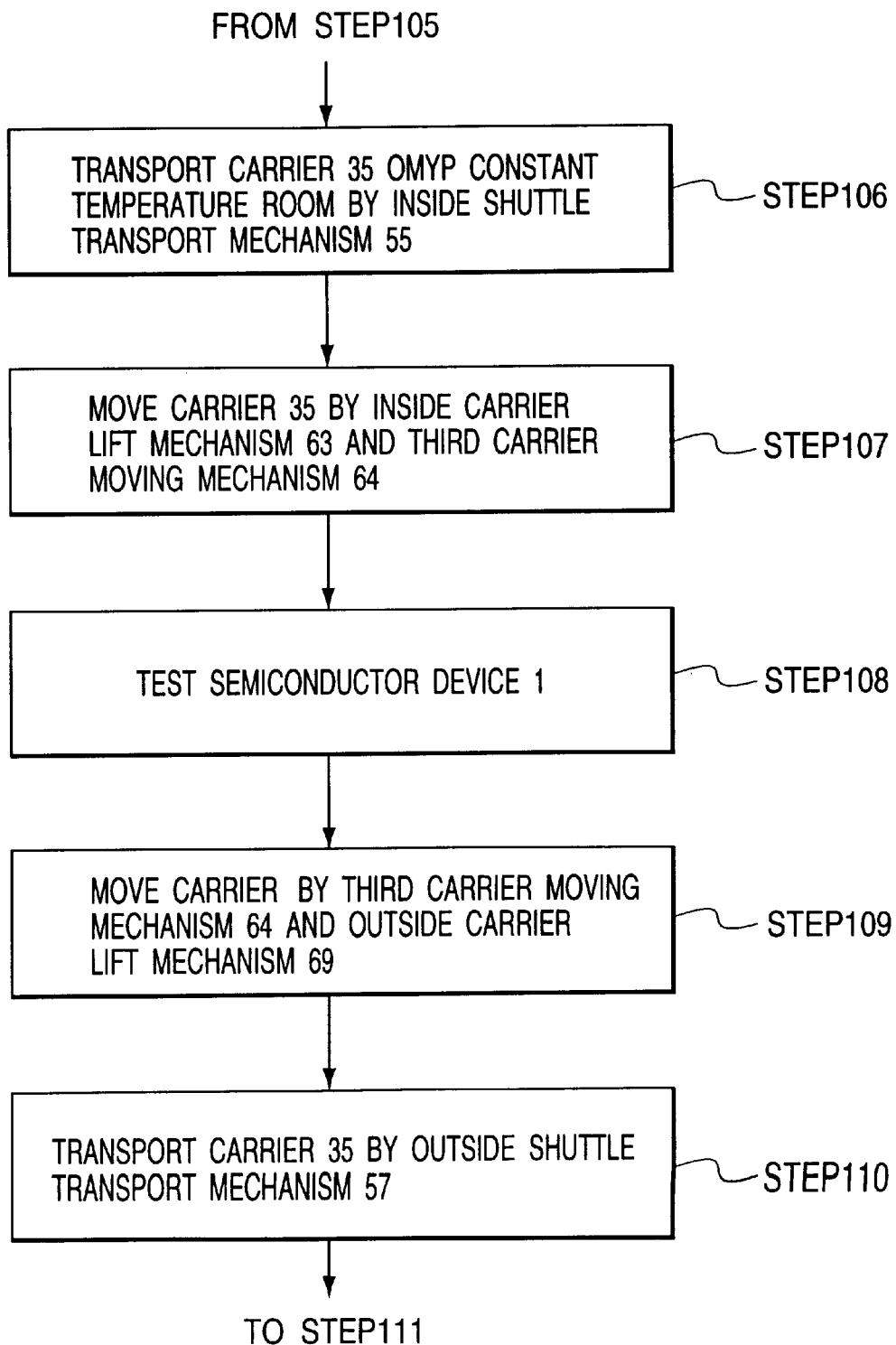
Figure 19:
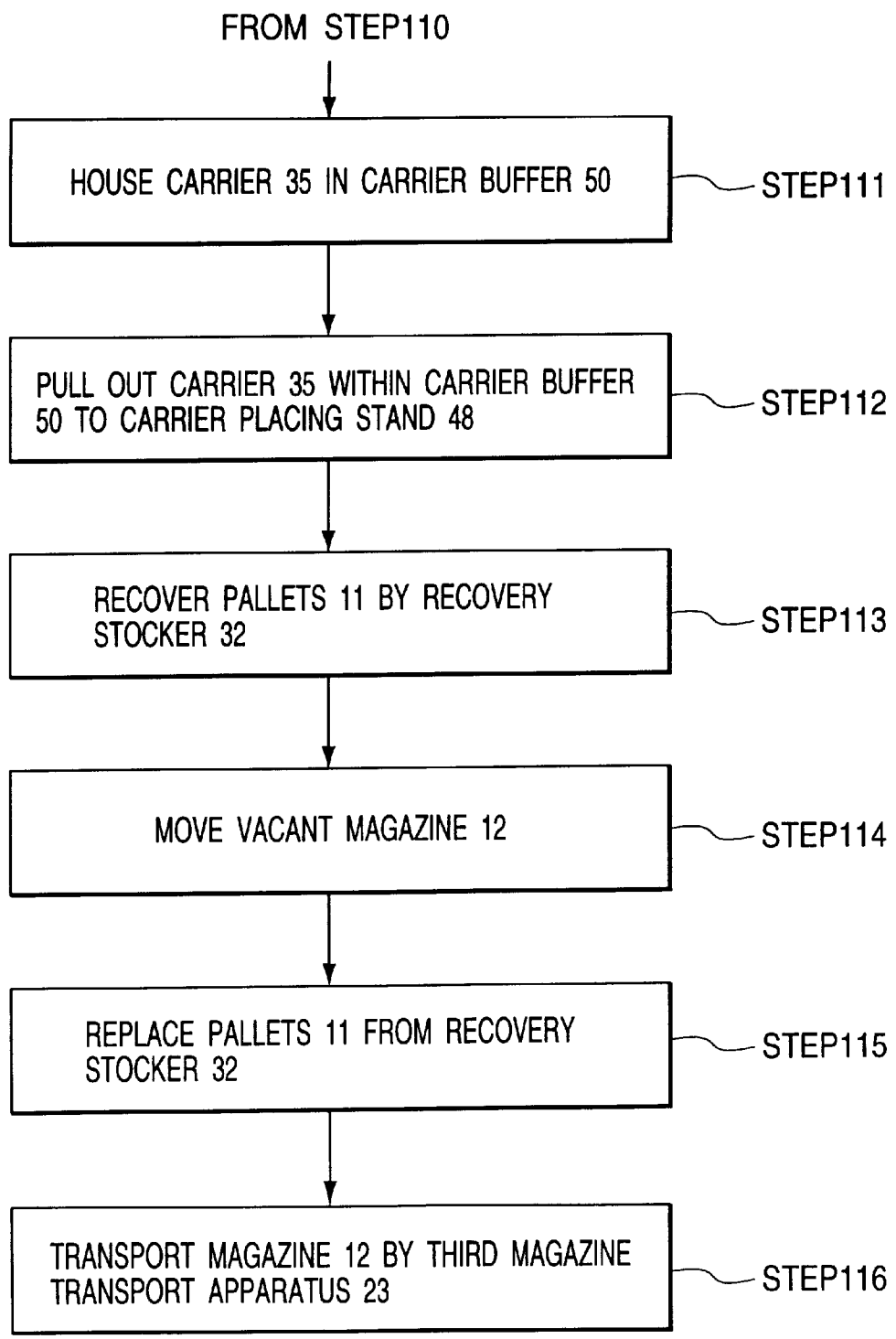

Now referring to the flowcharts shown in FIGS. 17 to 19, an explanation will be given of the transporting apparatus used in testing semiconductor devices according to the first embodiments.

In step S100, the magazine 12 set at the supplying position A of the magazine loader 14 reads the information on the device written in the IC card 13 attached to the magazine 12 to be opposite to the IC card reader 16 by optical communication technology and transfers it to the control section 17. In step S101, the magazine is transported to the pallet replacing position B by the first magazine transporting device 15. The first magazine transporting device 15 can transport plural magazines 12 at prescribed intervals.

In step S102, the pallets 12 are replaced from the magazine 12 into the distributing stocker 33. Specifically, when the first magazine lift mechanism 19 operates, the magazine 12 transported to the pallet replacing position B, while it is placed on the first magazine lift plate 18, is lifted so that the upper face of the magazine 12 formes no gap from the lower face of the distributing stocker 33 above the first magazine 12. In this state, when the pallet push-up unit A20 operates, the pallet push-up plate A21 rises from the opening area at the bottom of the magazine to lift the pallets 11 into the distributing stocker 33 (FIG. 8). Then, when the cylinders 41 and 42 operate, the pair of lift pieces 40 supported by the pallet loading mechanism 38 move into the distributing stocker 33. Thereafter, when the pallet push-up plate A21 falls, the grooves 11d formed on the bottom of the lowest pallet are supported by the pair of first lift pieces 40. Thus, replacement of the pallets into the distribution stocker 33 is completed. Then, when the cylinders 44 and 45 are operated, the pair of second pieces 43 are engaged into the grooves 11d of the second pallet from the lowest pallet (FIG. 11).

In step S103, the pallets 11 within the distributing stocker 33 will be located on the carrier 35. Specifically, the distributing stocker 33 housing the pallets 11 is moved onto the carrier 35 placed on the IN side carrier stand 36 by the distributing stocker moving mechanism 34. When the two-step stroke cylinder 39 make the stoke by two steps, the second and et seq. pallets 11 from the lowest one are supported by the pair of second pieces 43 to stay within the distributing stocker 33. The lowest pallet 11 falls while it is supported by the first lift pieces so that it is located on the carrier 35 in engagement of the through-holes 11c formed at the edges of the pallet with the pellet positioning pins 35a of the carrier 35. When the pallet 11 is placed on the carrier 35, the pair of first lift pieces 40 open once to rise to the position where the lowest pallet has be separated and close again. When it rises to the position of the stroke of zero of the two-step stoke cylinder 39, it picks up the pallet supported by the pair of second pieces 43. When the pair of second pieces 43 open, the two-step stroke cylinder 39 makes the stroke by one step to fall to the position where the lowest pallet 11 has been separated. The above operation is repeated so that a prescribed number of pallets are placed on the carrier 35.

In step S104, the carrier 35 is housed in the carrier buffer 50. Specifically, in FIG. 14, when the first carrier moving mechanism 52 operates, the carrier 35 with the pallets 11 placed thereon is moved from the IN side carrier stand 36 to the vacant one of the shelves 50a. The carrier buffer 50 is moved up by the carrier buffer lift mechanism 51 to the position where the carrier moving pins 52a is disengaged with the carrier through-holes 35c. Then, the carrier moving pins 52a are retracted to a prescribed position.

In step S105, the carrier 35 held temporarily within the carrier buffer 50 will be pulled out to the IN side lift stage 54. Specifically, the carrier buffer 50 is moved down so that the carrier 35 is lower than the pulling out position toward the IN side lift stage 54. After the carrier moving pins 53a are moved by the second carrier moving mechanism 53 to the side of the carrier buffer 50, the carrier buffer 50 is moved up to the position where the carrier moving pins 53a are engaged with the through-holes of the carrier 35c. Then, the carrier moving pins 53a are retracted to pull out the carrier 35 to the IN side lift stage 54.

In step S106, the IN side carrier transporting mechanism 55 will transport the carrier 35 to the IN side carrier lift mechanism 63 within the constant temperature room 62. Specifically, when the IN side lift stage 54 falls, the carrier 35 is carried onto the IN side shuttle 56 on standby below it. The IN side shuttle transporting mechanism 55 transports the carrier 35 to the IN side carrier lift mechanism 63 provided within the IN side shuttle transporting mechanism 55.

In step S107, the carrier 35 will be transported by the IN side carrier lift mechanism 63 and the third carrier moving mechanism 64. Specifically, when the IN side carrier lift 63 rises, the carrier 35 is carried onto the IN side open/close rail on the third carrier moving mechanism 64. The carrier 35 is further transported by the third carrier moving mechanism 64 to the die set section within the test station T/S.

In step S108, the devices 1 will be tested. In FIGS. 15 and 16, when the die set 65 within the test station T/S is driven upward, the positioner 65a passes through the opening 35b of the carrier 35 and the through-hole 11b to push up the device 1 to be positioned. Thus, the external output terminal of the device 1 hits on the contactor 80 of the test head 66. In this state, the electric items of the device 1 are tested by the tester body 68. Upon completion of the test, the die set 65 is restored to the previous position and the devices are received in the pallet 11. The test results are transferred from the tester body 68 to the control section 17.

In step S109, the carrier 35 is transported to the OUT side open/close rail by the third carrier moving mechanism 64. The OUT side carrier lift mechanism 69 rises to position the carrier 35, and falls to locate the carrier 35 on the OUT side shuttle 58 on standby below it.

In S110, by the OUT side shuttle transporting mechanism 57, the carrier 35 on the OUT side is transported to the OUT side lift stage 59 outside the constant temperature room 62.

In step S111, the carrier 35 on the OUT side lift stage 59 will be temporarily held within the carrier buffer 50. Specifically, the OUT side lift stage 59 is risen to engage the through-holes 35c of the carrier 35 with the carrier moving pins 60a. In this state, the carrier moving mechanism 60 holds the carrier 36 in the vacant one of the shelves 50a. Thereafter, the carrier buffer 50 is moved down by the carrier lift mechanism 51 to the position where the carrier moving pins 60a are disengaged with the carrier through-holes 35c. Then, the carrier moving pins 60a are retracted to a prescribed position.

In step S112, the carrier 35 will be pulled out to the OUT side lift stand 48. Specifically, the carrier buffer 50 is risen so that the carrier 35 held is higher than the pulling out position toward the OUT side lift stage 59. After the carrier moving pins 61a are moved by the fifth carrier moving mechanism 61 to the side of the carrier buffer 50, the carrier buffer 50 is moved down to the position where the carrier moving pins 61a are engaged with the through-holes 35c of the carrier 35c. Then, the carrier moving pins 53a are retracted to pull out the carrier 35 to the OUT side lift stand 48.

In step S113, the pallet 11 loaded on the carrier 35 placed on the OUT side carrier stand 48 is recovered by the recovery stocker 32 having the same structure as that of the distributing stocker 31. The recovery operation, which is the same as that of the distributing stocker 31, will not be explained here. The carrier 35 having completed the pallets is held in the carrier buffer 50 by the fifth carrier moving mechanism 61.

In step S114, the vacant magazine will be moved by the magazine traverse 29. Specifically, when the magazine 12 replaces the pallet into the distributing stocker 33 at the replacing position, it becomes vacant. The vacant magazine is moved temporarily to the second magazine transporting device 26 by the first magazine moving mechanism 27, and thereafter moved to the replacing position C of the magazine unloader 22 by the second magazine moving mechanism 28.

In S115, the pallets 11 will be replaced from the recovery stocker 31 into the magazine 12. Specifically, when the second magazine lift mechanism (not shown) operates, the magazine 12 transported to the pallet replacing position C, while it is located on the second magazine lift plate 24, is lifted so that the upper face of the magazine 12 formes no gap from the lower face of the recovery stocker 32 having moved to above the first magazine 12. In this state, when the pallet push-up unit B operates, the pallet push-up plate B lifts the pallets 11 held in to the recovery stocker 32 to release the pallet receiving piece of the recovery stocker 32. Then the pallet push-up plate falls to house the pallets into the magazine 12.

In step S116, the second magazine lift plate 24 falls to place the magazine 12 to the third magazine transporting device 23. When the magazine 12 is moved to the position E by the third magazine transporting device 23, the test result of the devices 1 are written in the IC card 13 by the IC card writer 24 located oppositely to the IC card 13.

In the transporting apparatus used in testing semiconductor devices according to the first embodiment, a plurality of pallets 11 each with devices 1 housed, while being placed on the carrier 35, are transported, the contactors 80 incorporated in the test head 66 are arranged so as to correspond to the external terminals of all the transported devices, and all the devices 1 are simultaneously pushed up using the die set 65 so that they are tested in contact between their external output terminals and contactors 80. Thus, a plurality of test handlers required in the prior art can be collected into a single test transporting apparatus.

The pallets 11 are supplied in a state where they are housed in the magazine 12, and the pallets 11 after test are recovered by the magazine. Thus, the test handler with high efficiency in the installing area, supply/recovery of the pallets and running can be provided.

The plurality of pallets 11, while being placed on the carrier, are transported to the test station T/S so that a large number of devices 1 can be simultaneously transported for test. This greatly improves the test efficiency.

Since the carrier buffer 50 is provided and the carrier 35 is transported by the shuttle installed within the constant temperature room 62, the carrier 35 can be transported to the front of the test head while the test is being executed so that it can be on standby with the devices 1 whose temperature has been elevated to that of the constant temperature room 62. The loss time in elevation of the temperature and transportation can be removed to enhance the test efficiency.

Each of the pallets 11 is provided with the pallet positioning pins 11a for positioning plural pallets, and the carrier 35 is provided with the opening areas 35b for pushing up the devices 1 loaded in the pallet and the through-holes 35c for positioning and transporting the carrier 35 in the loop of various mechanisms for carrier transporting. A plurality of test handlers required in the prior art can be collected into a single test transporting apparatus.

Second Embodiment

Figure 20:
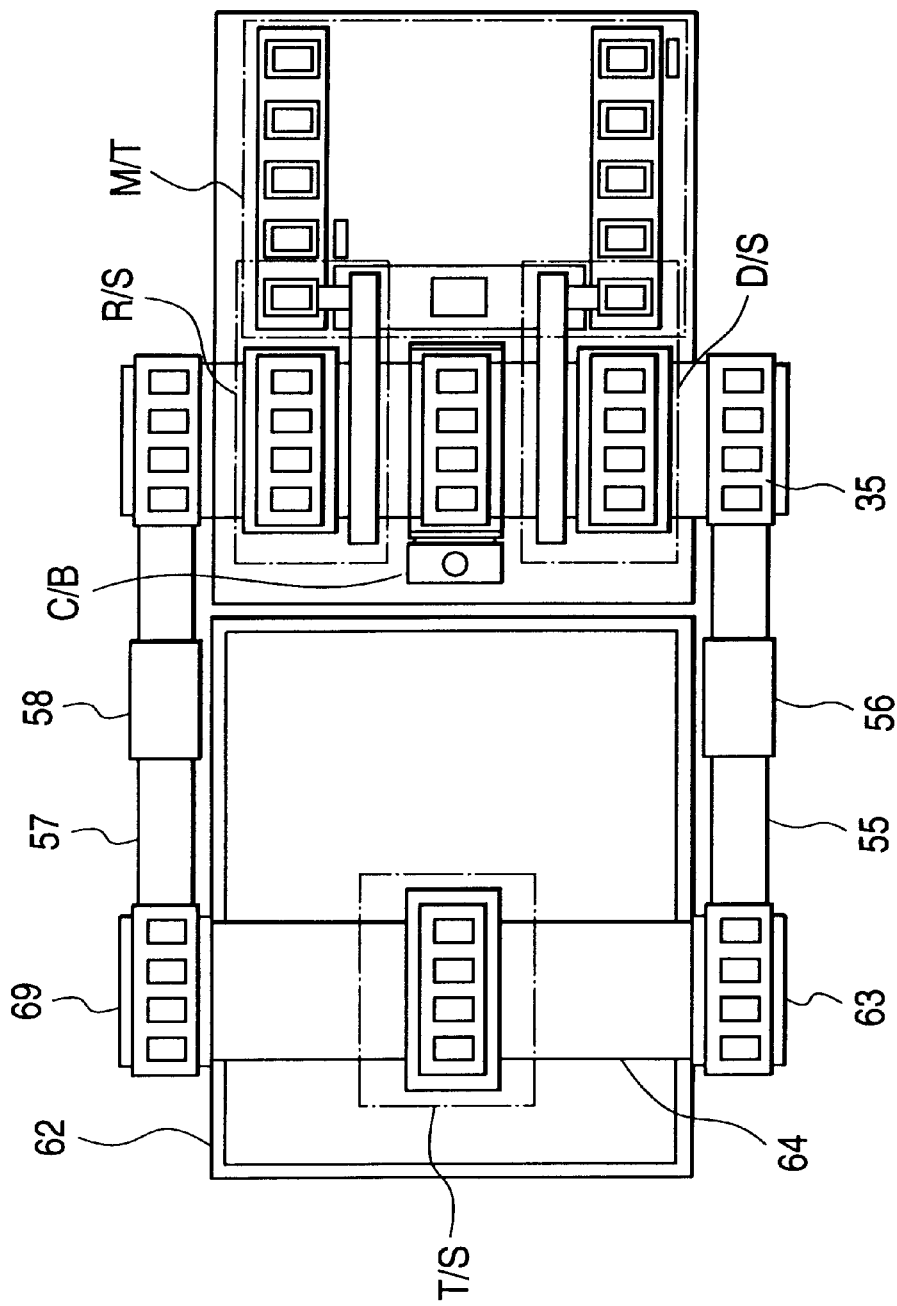
FIG. 20 is a schematic plan view of the entire structure of a transporting apparatus used in testing semiconductor devices according to the second embodiment of the present invention.

FIG. 20 is a schematic diagram of the transporting apparatus used in testing semiconductor devices according to the second embodiment. In this embodiment, the shuttle transporting mechanisms (inclusive of IN side shuttle transporting mechanism 55, IN side carrier lift mechanism 63, OUT side shuttle transporting mechanism 57 and OUT side carrier lift mechanism 69 in the first embodiment) are installed outside the constant temperature room 62. The IN side and OUT side open/close rails provided on both sides of the third carrier moving mechanism 64 are also installed outside the constant temperature room 62. In such a configuration, the carrier 35 is transported in a loop in such a manner that it is passed from the IN side shuttle 56 to the third carrier moving mechanism 64 and the carrier after test is passed from the third moving mechanism 64 to the OUT side shuttle 58.

In accordance with this embodiment, since the shuttle transporting mechanisms are provided outside the constant temperature room 62, the shuttle transporting system itself can be easily checked and the state of the devices in this system can be easily recognized. In this embodiment, from the standpoint of view of safety, the shuttle transporting system must be covered with a safety cover and provided with a safety guard on the front face thereof.

Third Embodiment

Figure 21:
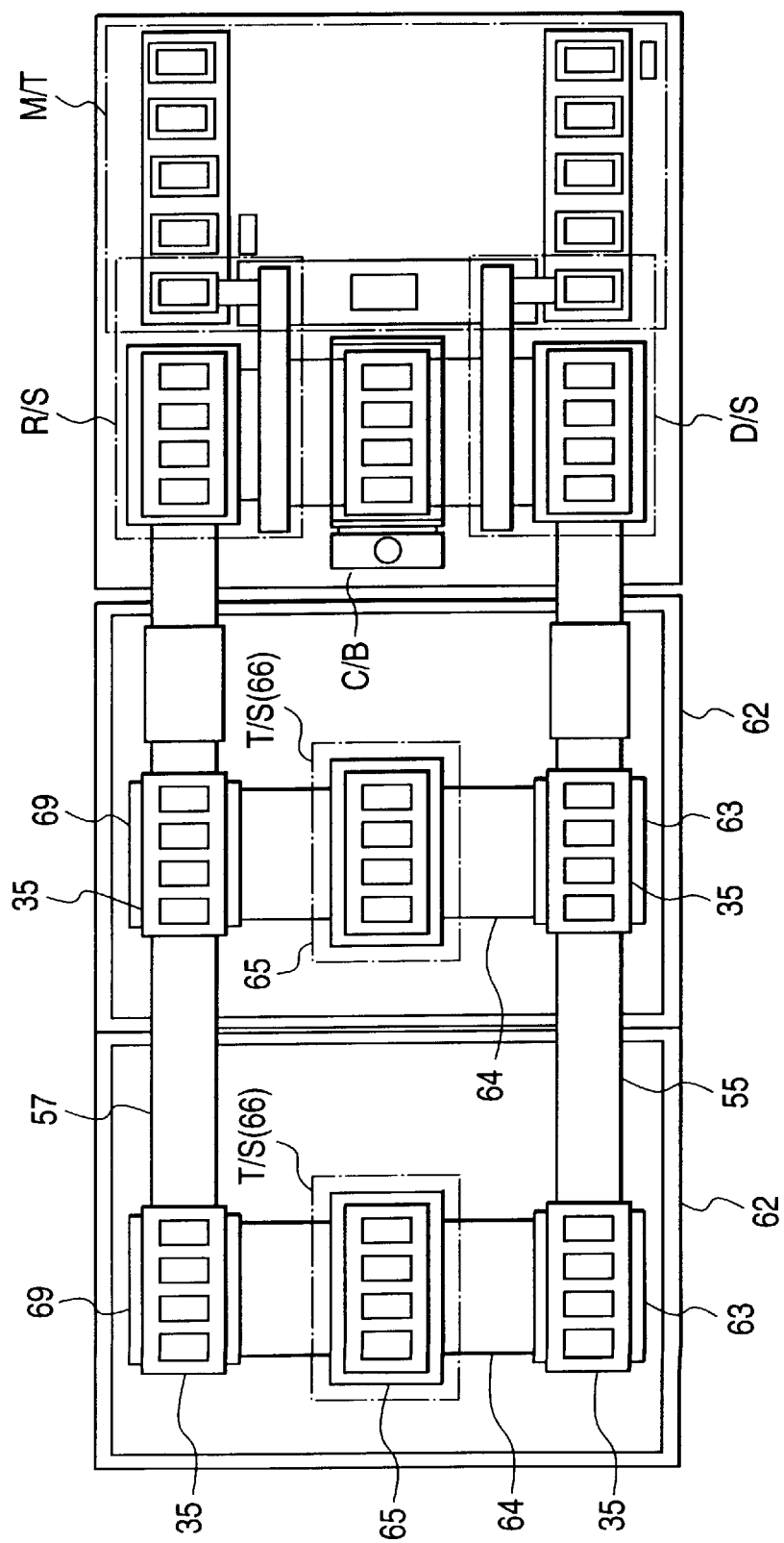
FIG. 21 is a schematic plan view of the entire structure of a transporting apparatus used in testing semiconductor devices according to the third embodiment of the present invention.

FIG. 21 is a schematic diagram of the transporting apparatus used in testing semiconductor devices according to the third embodiment. In this embodiment, plural units, each of which is composed of the test station T/S having the die set 65 and test head 66, third carrier moving mechanism 64, IN side carrier lift mechanism 63, OUT side carrier lift transporting mechanism 69, constant temperature room 62, are connected in succession. In addition, the IN side shuttle transporting mechanism 55 and the OUT side shuttle transporting mechanism 57 are provided for the supply/discharge of the carrier for each of the test stations T/S. The respective test stations T/S are connected to a single tester body 68. Such a configuration is efficient to test the devices whose capacity has been increased in recent years and takes a longer time for test.

Fourth Embodiment

The test head lifting apparatus according to the fourth embodiment of the present invention is shown in FIGS. 22A to 22C and 23A to 23B. As seen from FIGS. 22A to 22C, plural contactors 80(a), 80(b) are provided on a test board 81 and each contactor 80 has a contact to be brought into contact with the external output terminal of the device 1. On the test board 81, connectors 82 electrically connected to the contactors 80(b) are provided. The test board 81 is connected to the test head 66 through the connectors 82. A test head supporting mechanism 83 for positioning the test head 66 is attached to a test head lift mechanism 84. The test head lift mechanism 84 is attached to the constant temperature room 62. A test board supporting mechanism 85 for positioning the test board 81 is attached to the test head supporting mechanism 83 through the test board lift mechanism 86.

A guide shaft 87 is provided behind the test head supporting mechanism 83 to ascend and descend it. The guide shaft 87 is supported by a guide 88 attached to the constant temperature room 62. A rotary shaft 89 for tilting the test head 66 is provided on the one side thereof and supported by the test head supporting mechanism 83 through fixed metal fittings 90. A stopper 91 is provided on the other side thereof and serves to hold the test head horizontal in its hitting against the test head supporting mechanism 83. Incidentally, an auxiliary device 92 is an extendable guide bar for reducing the force tilting the test head 66.

Figure 22A:
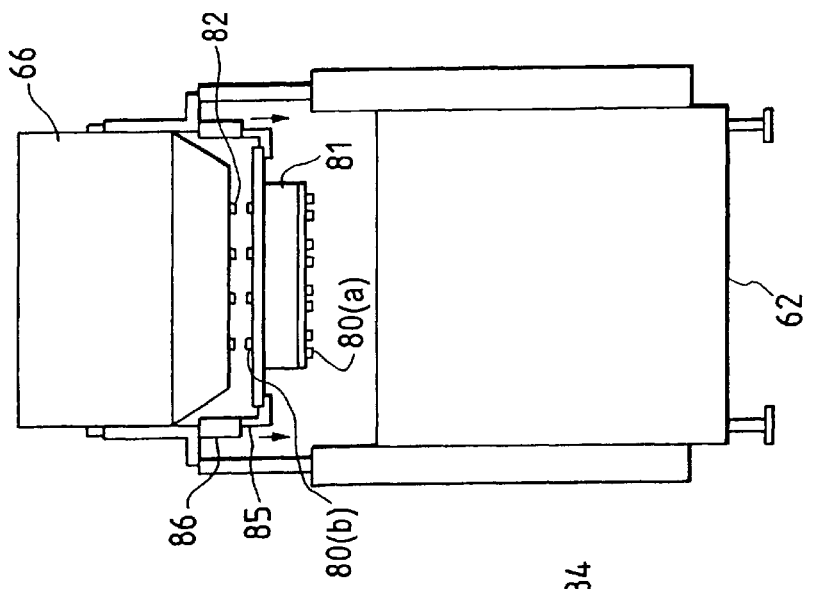
FIGS. 22A to 22C and 23A and 23B are test head lifting device according to the fourth embodiment.
Figure 22B:
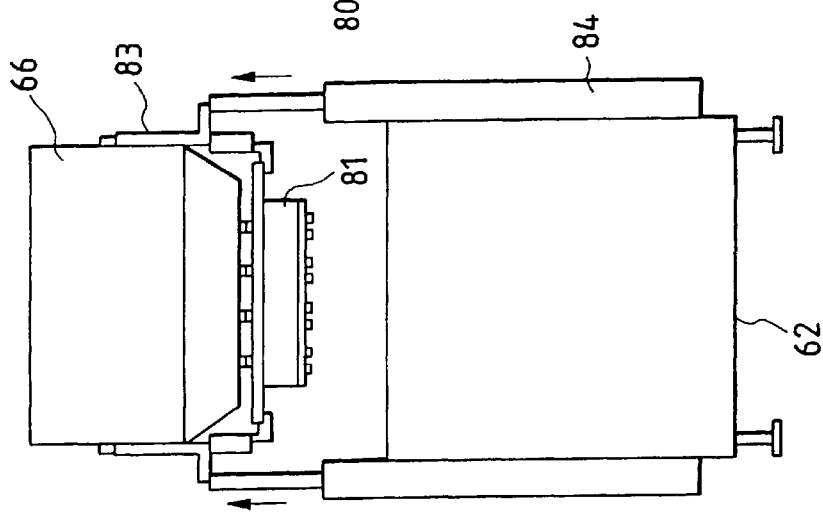
Figure 22C:
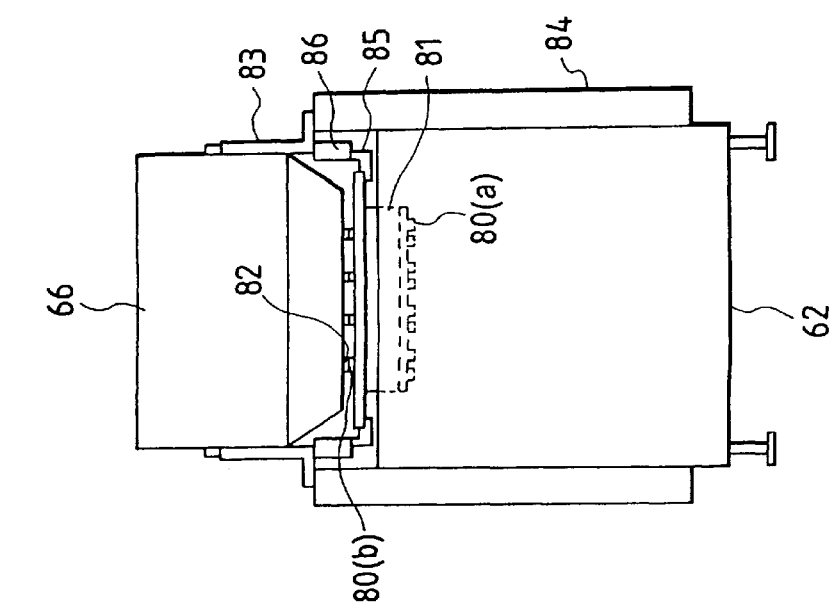
Figure 23B:
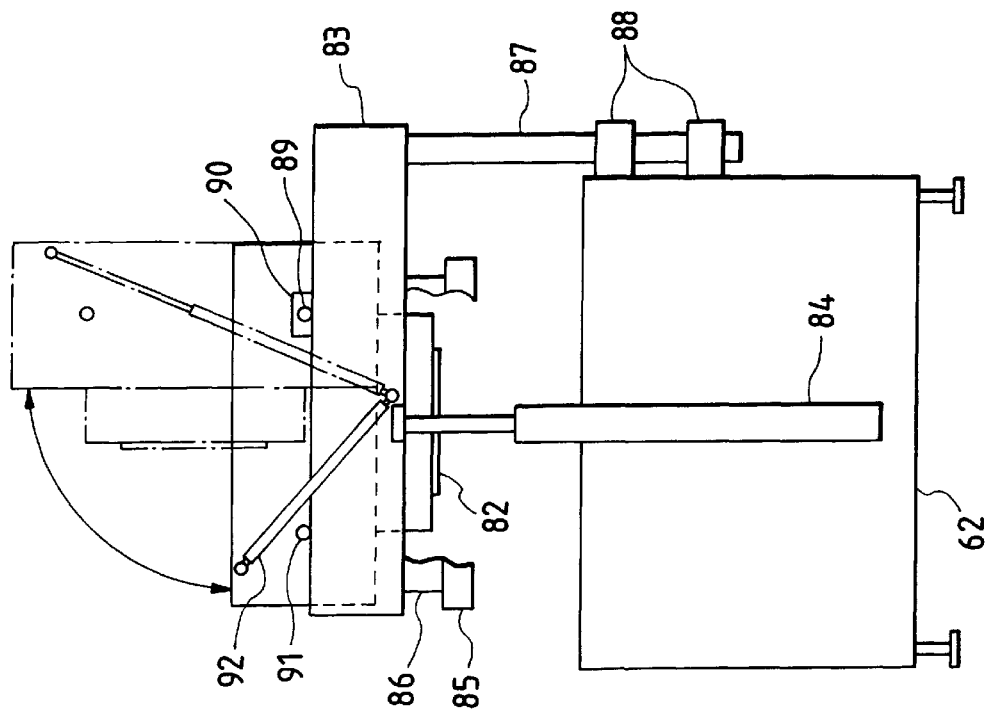
Figure 23A:
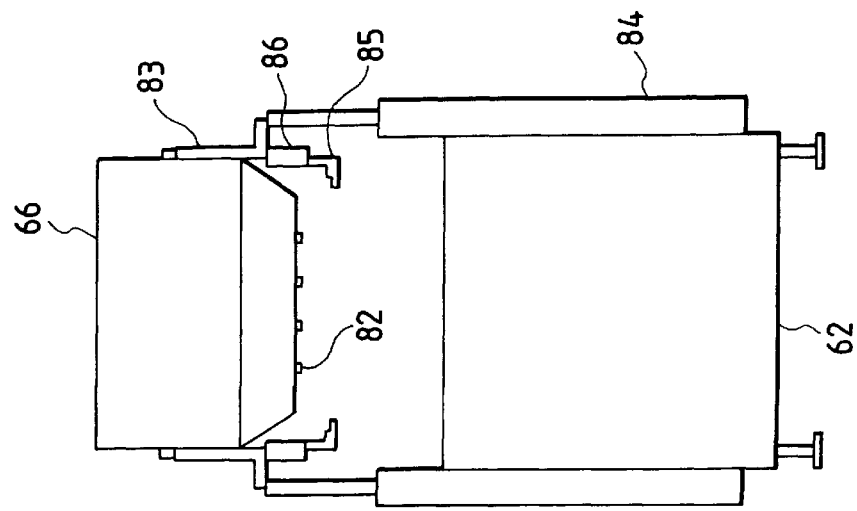

An explanation will be given of the operation of the fourth embodiment. FIG. 22A shows the state of the test head 66 during a normal test. In removing the test board 81, as shown in FIG. 22B, the test head 66 is moved up by the ascending operation of the test head lift mechanism 84 so that the test board 81 is exposed outside the constant temperature room 62. By the descending operation of the test head lift mechanism 86, the connection of the connectors 82 is released to result in the state shown in FIG. 22C. In this state, the test board 81 is removable. When the exchange of the test board 81 is required because of a change in the shape of the device 1 to be tested, it is made in this state. When the checking or repairing of the test board 81 is required, it can be easily executed by removal of the test board 81. The test board 81 is attached in the procedure reverse to that described above.

Where the test head 66 should be further checked or repaired, the test board 81 in the state of FIG. 22C is removed to result in the state of FIG. 23A. As indicated by the one-dot chain line of FIG. 23B, when the test head 66 is lifted rearward by a human hand, it is tilted on the rotary shaft 89 supported by the test head supporting mechanism 83. With the aid of the auxiliary device 92, it can be easily tilted to a prescribed position on the center of the rotary shaft 89.

As described above, in accordance with the fourth embodiment, since the test head 66 can be moved up so as to be exposed outside the constant temperature room 62, the test board 81 can be easily checked or exchanged. By tilting the test head 66, the test head 66 can be checked and the interior of the constant temperature room 62 can be easily checked.

Fifth Embodiment

Figure 24:
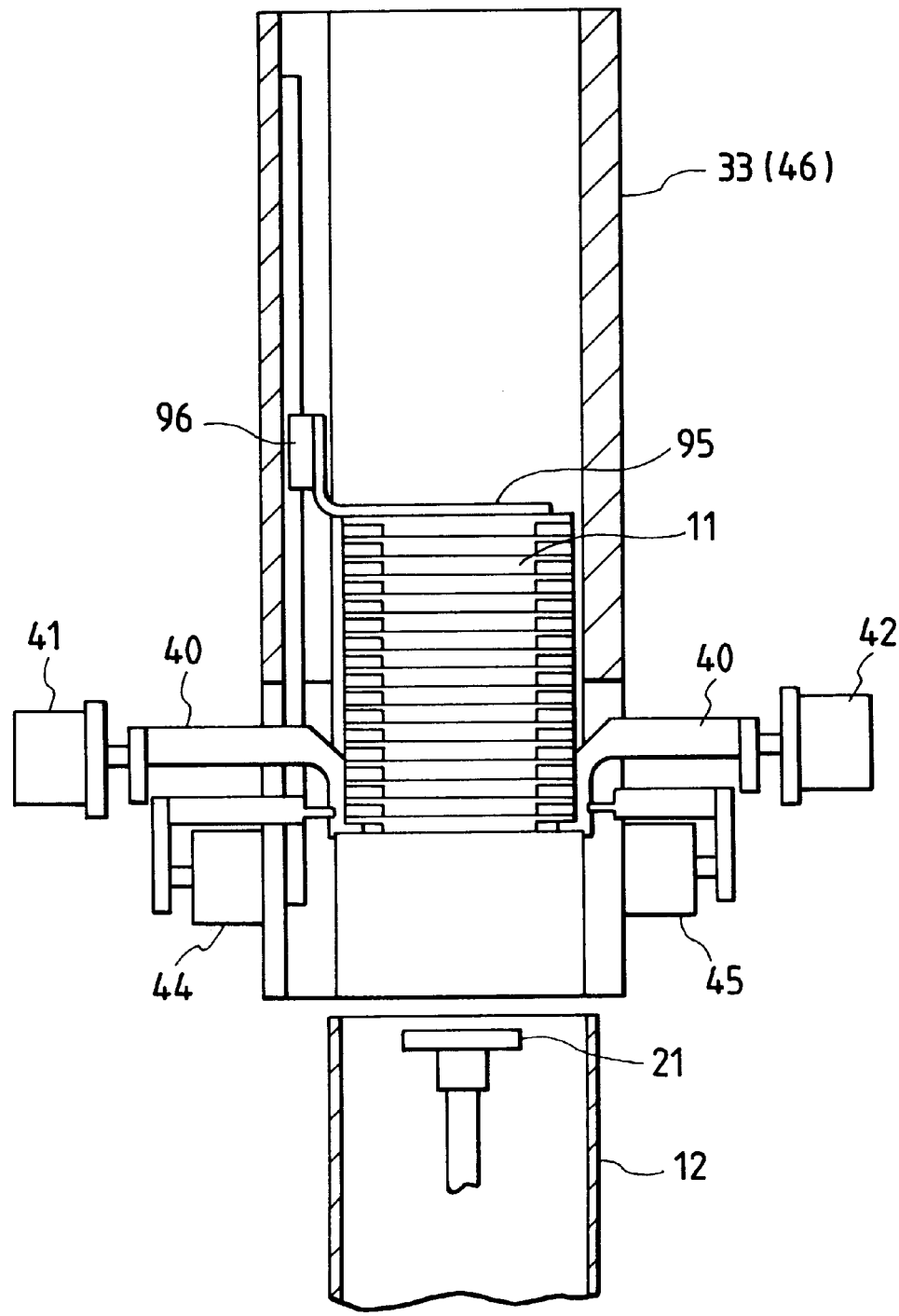
FIG. 24 is a side view of the distributive stocker and recovery stocker according to the fifth embodiment.

FIG. 24 is a side view of the distributing stocker and recovery stocker according to the fifth embodiment of the present invention. The distributing stocker 33 or recovery stocker 46 for housing the pallets 11 includes a square plate 95. The square plate 95 is supported by a lift guide 96 so that it can ascend and descend in the stocker. The square plate 95 which is in contact with the upper face of the highest pallet 11 housed in the distributing stocker 33 or recovery stocker 46 ascends or descend to follow the ascent and descent of the pallet 11.

In accordance with the fifth embodiment, it is possible to prevent the devices 1 from extruding from the receiving grooves 11a of the pallet 11.

Sixth Embodiment

Figure 25A:
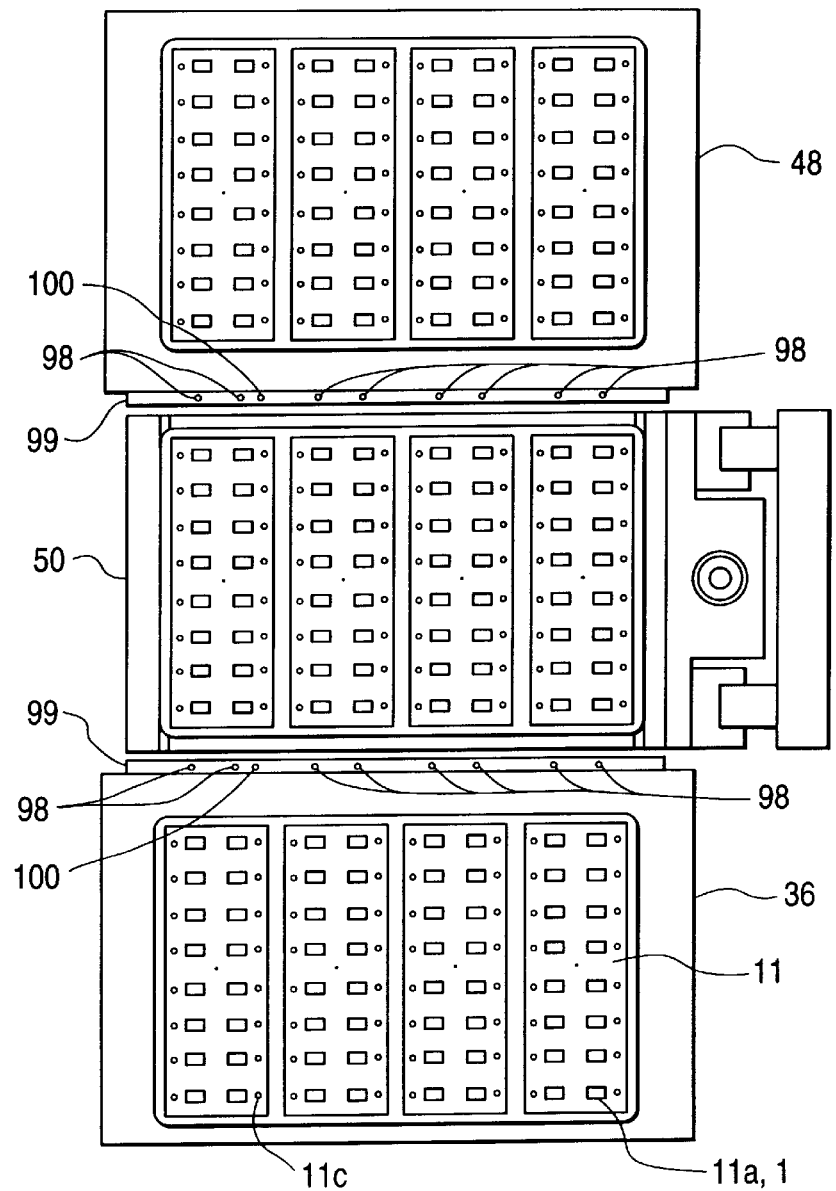
FIGS. 25A and 25B are a plan view and front view of the device housed in the pallet according to the sixth embodiment.
Figure 25B:
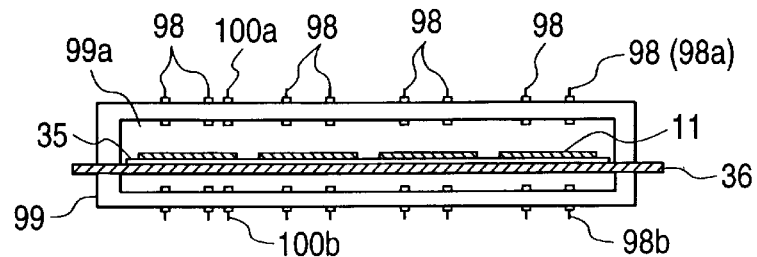

FIG. 25 is a plan view and a front view showing means for the presence/absence of devices housed in the pallet according to the sixth embodiment. As seen from FIG. 25, sensor brackets 99 each having transmission type photoelectric sensors 98 are mounted at two points on the sides of the carrier buffer 50 of the IN side carrier stand 36 and OUT side carrier stand 48. The sensor bracket 99 includes a first carrier movement mechanism 52, fifth carrier movement mechanism 61, and opening hole 99a through which the carrier 35 on which the pallet is placed passes.

The sensor 98a on the side of light projection and the sensor 98b on the side of light reception form a pair so that the optical axes of the sensors pass the through-holes 11b made in the device receiving grooves 11a. The sensor bracket 99 is provided with a pair of a transmission-type sensor 100a on the side of light projection and a transmission-type sensor 100b on the side of light reception. The optical axes of these sensors are located to pass through the through-holes 11c formed at the edges of the pallet 11. The pair of transmission photo-electric sensors 98 are attached linearly in a movement direction of the carrier 35 and their number is equal to that of receiving grooves 11a of a plurality of pallets perpendicular to the movement direction.

An explanation will be given of the operation of the sixth embodiment of the present invention. When the carrier 35 on which the pallets 11 are placed is housed from the IN side carrier stand 36 into the carrier buffer 50 by the first carrier moving mechanism 52, or taken out from the carrier buffer 50 to the OUT side carrier stand 48 by the fifth carrier moving mechanism 61, the carrier 35 on which the pallets are placed passes through the through-hole 99a of the sensor bracket. In this case, at the instant when the optical axes of the pair of transmission type photoelectric sensors 98 pass the through-holes 11c at the both edges of each pallet 11, these photoelectric sensors 98 check whether or not the devices have been received in the groove 11a.

In accordance with the sixth embodiment of the present invention, the control section 17 compares the checking result (data) of the presence or absence of the devices 1 by the pair of transmission photoelectric sensors 98 when the carrier 35 on which the pallets 11 are placed passes from the IN carrier stand 36 to the carrier buffer 50 with that when the carrier 35 is taken out from the carrier buffer 50 to the OUT side carrier stand 48. If the coincidence is not obtained, this means that the device 1 falls out from the transporting system, thus making it possible to find the abnormality in the transporting system.

Seventh Embodiment

Figure 26:
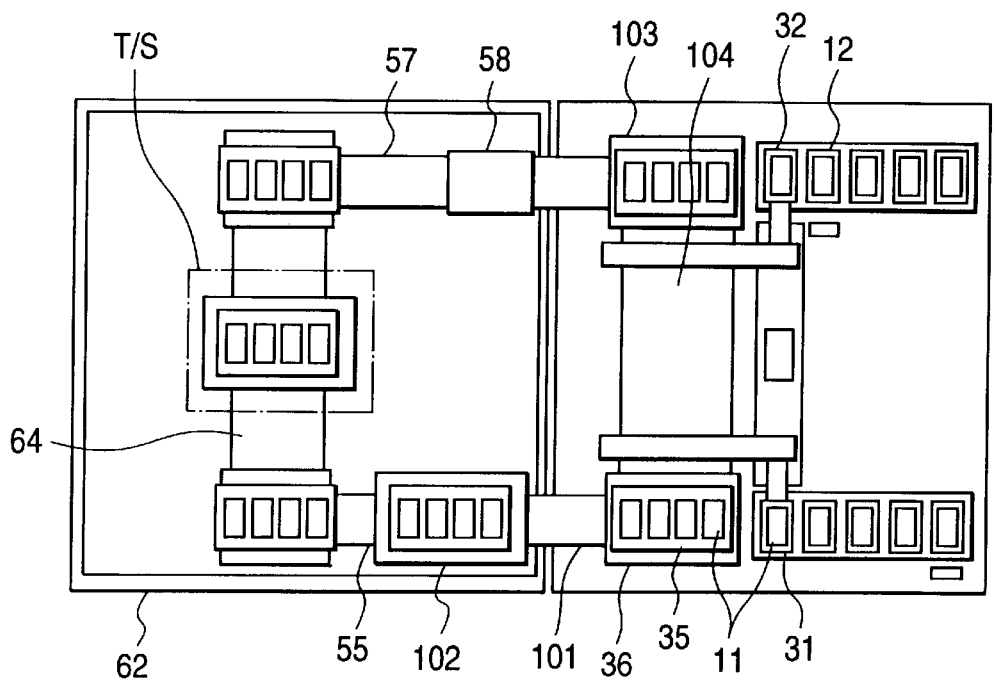
FIG. 26 is a schematic diagram of a transporting apparatus used in testing a semiconductor device according to a seventh embodiment of the present invention.

FIG. 26 is a schematic diagram of the transporting apparatus used in testing the semiconductor devices according to the seventh embodiment. Now it is assumed that the carrier buffer according to the first embodiment is installed within the constant temperature room. As seen from FIG. 26, by the IN side carrier moving mechanism 101, the carrier 35 on which the pallets 11 are aligned by the distributing stocker 31 is transported from the IN side carrier stand 36 to the highest step of the carrier buffer 102 installed within the constant temperature room 62. The carrier buffer 102 can house a plurality of carriers 35 in plural steps. When the carrier 35 is placed on the highest step, it descends by one step. When a next carrier 35 is placed thereon, the first carrier 35 descends further descend by one step. As a result of such an operation, when the first carrier 35 reaches the lowest step, it is placed on the IN side shuttle 56 of the IN side shuttle transporting mechanism 55. The carrier 35 is transported to the test station T/S by the IN side shuttle transporting mechanism 55, third carrier mechanism 64, etc. to test the devices 1. Upon completion of the test, the carrier 35 is transported by the OUT side shuttle 58 and OUT side shuttle transporting mechanism 57 externally from the constant temperature room 62. The carrier 35 on the OUT side shuttle 58 transported externally is lifted by the carrier lift mechanism A103 to the recovery stocker 32 so that the pallets 11 are recovered into the magazine 12. Upon completion of the recovery, the carrier 35 is shifted to the lower part of the distributing stocker 31 by the OUT side carrier movement mechanism 104.

In the seventh embodiment of the present invention, as described above, the carrier 35 on which the pallets 11 each with the devices 1 are placed is stocked in the carrier buffer 102 within the constant temperature room 62. While the carrier 35 is stocked, the temperature of the devices 1 reaches that of the constant temperature 62, i.e., testing temperature of the devices 1. For this reason, as soon as the devices 1 are transported to the test station T/S, the test thereof can be started immediately. Thus, this embodiment can provide a transporting apparatus used in testing the semiconductor devices which can disregard the waiting time to elevate the temperature of the devices to a prescribed value.

Eighth Embodiment

Figure 27:
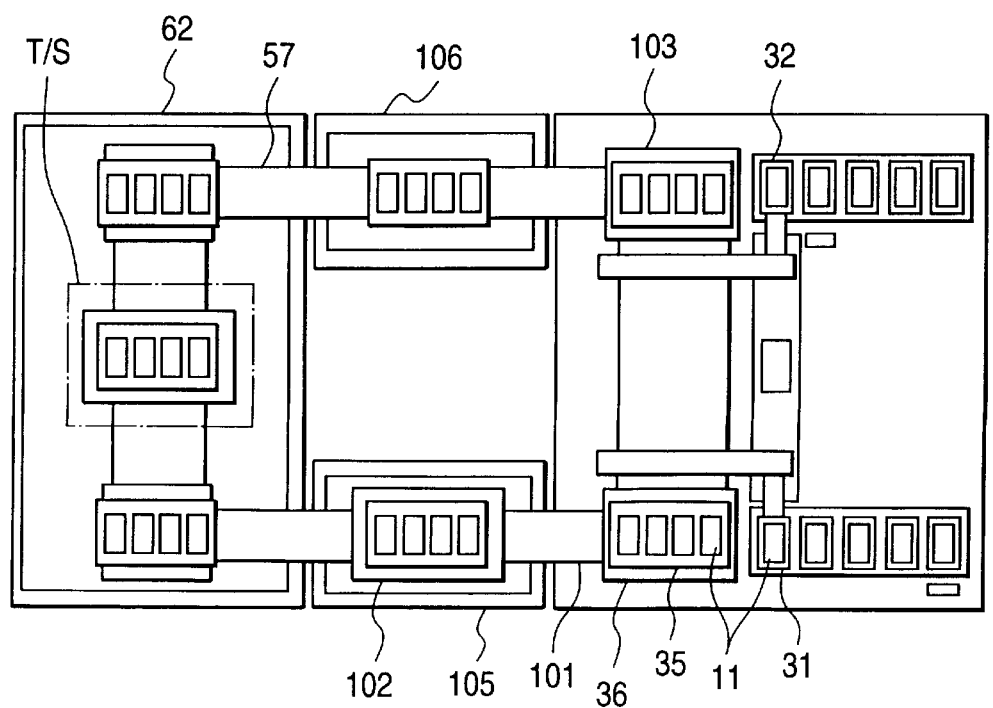
FIG. 27 is a schematic diagram of a transporting apparatus used in testing a semiconductor device according to an eighth embodiment of the present invention.
Figure 28:
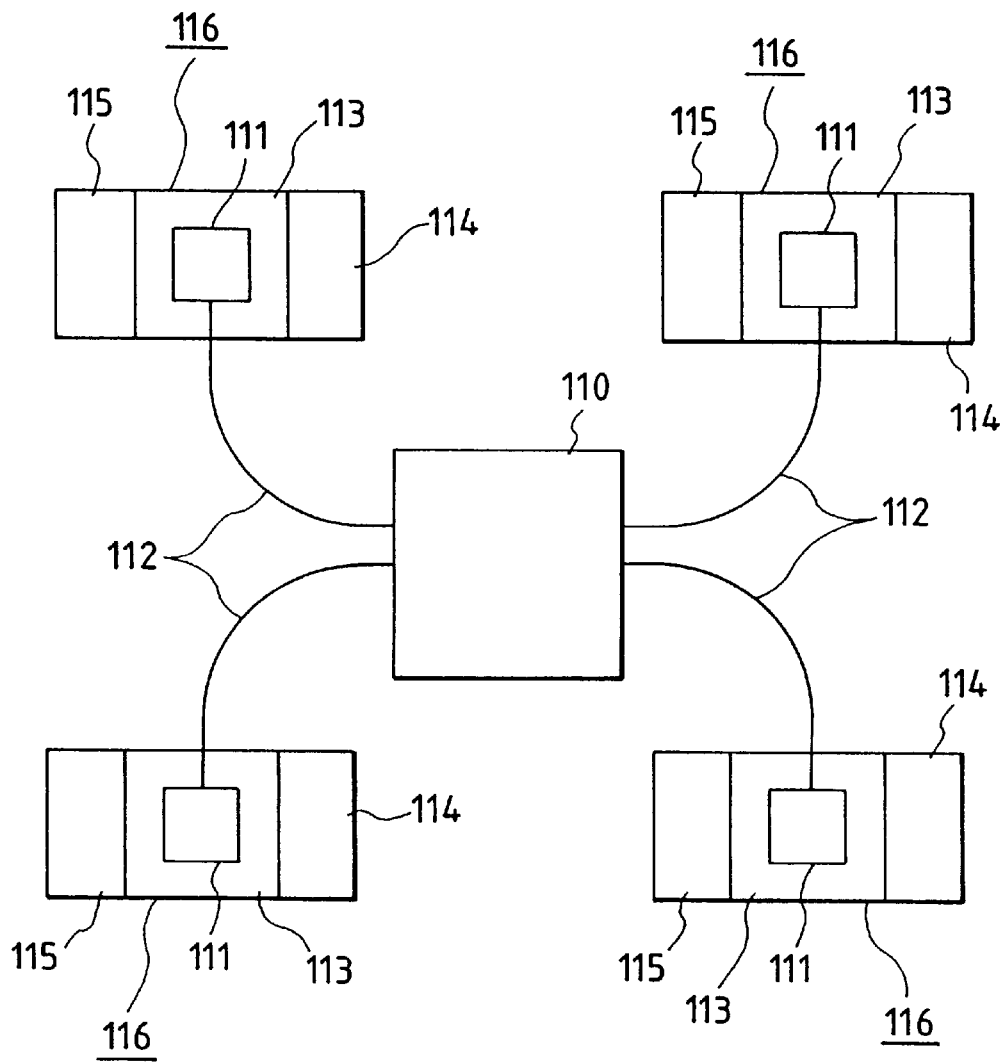
FIG. 28 is a schematic diagram of a conventional testing apparatus for semiconductor devices.

FIG. 27 schematically shows a transporting apparatus used in testing semiconductor devices according to the eighth embodiment. In this embodiment, the constant temperature rooms are provided in the IN side and OUT side transporting paths, respectively. As seen from FIG. 27, the carrier buffer 102 is installed in the constant temperature room 105 in the IN side carrier transporting path. The IN side carrier movement mechanism 101 transports the carrier 35 on which the pallets are placed from the IN carrier stand 36 to the highest step of the carrier buffer 102 provided within the constant temperature room 102.

On the other hand, between a constant temperature room 62 and a carrier lift mechanism A103 where the OUT side shuttle transporting mechanism 57 passes, the constant temperature room 106 is arranged. The remaining structure is the same as in the seventh embodiment.

The constant temperature of the test station T/S is set for about −55° C. for the purpose of the test of the devices 1 at a lower temperature. The constant temperature room 105 of the IN side transporting path is set for the temperature equal to that of the constant temperature room 62 in order to cool the devices 1 previously. In order to prevent condensation from occurring in the devices 1 transported from the constant temperature room 62, warm wind is sprayed on the constant temperature room 106 of the OUT side transporting path.

In accordance with the eighth embodiment, as described above, the carrier 35 on which the pallets 11 each with the devices 1 are placed is stocked in the carrier buffer 102 within the constant temperature room 105. While the carrier 35 is stocked, the temperature of the devices 1 reaches that of the constant temperature 62, i.e., testing temperature of the devices 1. For this reason, as soon as the devices 1 are transported to the test station T/S, the test thereof can be started immediately. The devices tested at a lower temperature makes condensation when it is taken out at room temperature, thereby reducing the insulating withstand strength and characteristic. For this reason, the devices 1 are heated to prevent condensation while they are placed within the constant temperature room 105.

Further, since the devices 1 are previously cooled and transported to the test station T/S, this embodiment permits the test to be executed efficiently without considering the waiting time to reduce the temperature of the devices to a prescribed value. In addition, the constant temperature room can prevent the condensation of the devices 1. Thus, this embodiment can provide a transporting apparatus used in testing the semiconductor devices.

What is claimed is:

1. A transporting apparatus used in testing a plurality of semiconductor devices, comprising:

a magazine having a plurality of pallets stacked in plural stages, each pallet having plural semiconductor devices placed thereon, said plurality of pallets stacked in said magazine forming a single stacked unit;

a distributing stocker mechanism configured to place said single stacked unit of said plurality of pallets stacked in said magazine into a distributing stocker via a single placing action and to distribute a portion of the plurality of pallets from the single stacked unit of the distributing stocker onto a carrier;

a test station provided within a constant temperature room for testing said plurality of semiconductor devices on the portion of the plurality of pallets carried by the carrier;

a carrier transporting mechanism including an IN side carrier transporting mechanism for transporting the carrier with said pallets thereon to said test station and an OUT side carrier transporting mechanism for transporting said carrier after testing to outside said constant temperature room; and a recovery stocker mechanism configured to place the portion of the plurality of pallets carried by said carrier into a recovery stocker after testing, form another single staked unit of said plurality of pallets, and to place, at one time, all said plurality of pallets of said other single staked unit from said recovery stocker into said magazine, wherein said distributing stocker mechanism
includes a pallet pushing up unit which moves from an opening of a lower face of said magazine to below said distributing stocker mechanism thereby to lift said plurality of pallets into said disbributing stocker, and
serves to hold said plurality of pallets lifted, and to descend, separate and distribute said plurality of pallets one by one from the lowest pallet.

2. A transporting apparatus according to claim 1 further comprising:

a magazine loader for transferring information of the devices before testing read from a storage medium to a controller and transporting said magazine to said distributing stocker mechanism;

a magazine traverse for transporting said magazine which has become vacant as a result of placing said plurality of pallets in the distributing stocker; and a magazine unloader for transporting said magazine stacked with the plurality of pallets moved from the said recovery stocker and recording a test result of said semiconductor devices on said storage medium.

3. A transporting apparatus according to claim 1, further comprising a carrier buffer for temporarily holding, in plural stages, said carrier with said portion of the plurality of pallets before testing and after testing.

4. A transporting apparatus according to claim 1, further comprising a carrier buffer for temporarily holding, in plural stages, said carrier with said portion of the plurality of pallets before testing, said carrier buffer being installed in said constant temperature room.

5. A transporting apparatus according to claim 1, further comprising a carrier buffer for temporarily holding, in plural stages, the carrier with said portion of the plurality of pallets after testing, said carrier buffer being installed in said constant temperature room.

6. A transporting apparatus according to claim 1, wherein said carrier transporting mechanism is installed within said constant temperature room.

7. A transporting apparatus according to claim 1, wherein said carrier transporting mechanism is installed outside said constant temperature room.

8. A transporting apparatus according to claim 1, further comprising a plurality of constant temperature rooms each having a test station, and said carrier is supplied into or discharged from each test station by said carrier transporting mechanism.

9. A transporting apparatus according to claim 1, wherein said distributing stocker moving mechanism moves said distributing stocker to align the portion of said plurality of pallets on said carrier on an IN side carrier stand.

10. A transporting apparatus according to claim 9, wherein a plate, in contact with the pallets housed in said stocker, is provided in said distributing stocker.

11. A transporting apparatus according to claim 1, wherein the pallets aligned on said carrier on the OUT side carrier stand are successively stacked in said recovery stocker, and said transporting apparatus further comprising a pallet push-up unit B which moves from an opening of the lower face of a vacant magazine moved to below said distributing stocker thereby to lift said pallets within said recovery stocker and thereafter descend when a pallet holding mechanism of said recovery stocker is released, thereby housing said pallets into the magazine.

12. A transporting apparatus according to claim 11, wherein a plate, in contact with the pallets housed in said stocker, is provided in said recovery stocker.

13. A transporting apparatus according to claim 1, further comprising:

means for detecting the presence or absence of each of the plurality of semiconductor devices on said carrier on an IN side carrier stand; and means for detecting the presence or absence of each of the plurality of semiconductor devices on said carrier on an OUT side carrier stand, whereby detecting results are compared with each other.

14. A transporting apparatus used in testing semiconductor devices, comprising:

a plurality of pallets on each of which a plurality of semiconductor devices are placed at prescribed positions where openings are provided;

a carrier on which a portion of the plurality of pallets are positioned, and including through-holes;

a die set having a positioner for positioning and pushing up each of the plurality of semiconductor devices; and a test head having contactors for testing the plurality of semiconductor devices;

wherein in testing the plurality of semiconductor devices, the positioner of said die set pushes up each of said plurality of semiconductor devices through said through-holes of the carrier and the openings of the pallet so that external terminals of said plurality of semiconductor devices are connected to the contactors of said test head.

15. A transporting apparatus used in testing semiconductor devices, comprising:

a test board having first contactors to be brought into contact with external terminals of semiconductor devices for testing said semiconductor devices, and second contactors;

a test head for removably supporting said test board and having connectors to be brought into contact with said second contactors of the test board;

a test head supporting mechanism for supporting said test head; and a test head lift mechanism for ascending and descending said test head supporting mechanism to take out said test head from a constant temperature room, wherein said test head includes a device for tilting said test head with respect to said test head supporting mechanism.

16. A transporting method used in testing a plurality of semiconductor devices, comprising:

stacking a plurality of pallets in a magazine forming a single stacked unit, each pallet having plural semiconductor devices placed thereon;

placing said single stacked unit of said plurality of pallets in said magazine into a distributing stocker via a single placing action and distributing portion of the plurality of pallets from the single stacked unit of the distributing stocker onto a carrier;

testing said plurality of semiconductor devices on the portion of the plurality of pallets carried by the carrier in a test station provided within constant temperature room;

transporting said pallets thereon to and from the test station via a carrier transporting mechanism, the carrier transporting mechanism having an IN side carrier transporting mechanism for transporting the carrier with said pallets thereon to said test station and an OUT side carrier transporting mechanism for transporting said carrier after testing to outside said constant temperature room; and placing the portion of the pallets carried by said carrier into a recovery stocker after testing to form another single staked unit of said plurality of pallets, and placing, at one time, all said plurality of pallets of said other single staked unit from said recovery stocker into said magazine, wherein said step of placing said single stacked unit of said plurality of pallets stacked in said magazine into a distributing stocker via a single placing action and distributing a portion of the plurality of pallets from the single stacked unit of the distributing stocker onto a carrier includes lifting said plurality of pallets into said distributing stocker by moving a pallet pushing up unit from an opening of a lower face of said magazine to below said distributing stocker, and descending, separating and distributing said plurality of pallets one by one from the lowest pallet.

17. The transporting method of claim 16, further comprising:

reading information of the device before testing from a storage medium;

transferring the read information to a controller and transporting said magazine to said distributing stocker;

reverse transporting said magazine which has become vacant as a result of placing said recovery stocker and recording a test result of said semiconductor devices on said storage medium.

18. The transporting method of claim 16, further comprising temporarily holding, in plural stages, said carrier with said portion of the plurality of pallets, before testing and after testing, in a carrier buffer.

19. The transporting method of claim 16, further comprising temporarily holding, in plural stages, said carrier with said portion of the plurality of pallets, before testing, in a carrier buffer installed in said constant temperature room.

20. The transporting method of claim 16, further comprising temporarily holding, in plural stages, the carrier with said portion of the plurality of pallets, after testing, in a carrier buffer installed in said constant temperature room.

21. The transporting method of claim 16, wherein said carrier transport mechanism is installed within said constant temperature room.

22. The transporting method of claim 16, wherein said carrier transport mechanism is installed outside said constant temperature room.

23. The transporting method of claim 16, further comprising supplying said carrier into or discharging said carrier from each of a plurality of test stations, each test station being in a corresponding one of a plurality of constant temperature rooms, via said carrier transporting mechanism.

24. The transporting method of claim 16, wherein said distributing stocker is moved to align the portion of said plurality of pallets on said carrier on an IN side carrier stand.

25. The transporting method of claim 24, wherein a plate, in contact with the pallets housed in said stocker, is provided in said distributing stocker.

26. The transporting method of claim 16, wherein the pallets aligned on said carrier on the OUT side carrier stand are successively stacked in said recovery stocker, and said transporting method further comprising moving a vacant magazine to below said distributing stocker, lifting said pallets within said recovery stocker by moving a pallet push-up unit from an opening of the lower face of the vacant magazine, and descending said push-up unit B when a pallet holding mechanism of said recovery stocker is released, thereby housing said pallets into the magazine.

27. The transporting method of claim 26, wherein a plate in contact with the pallets housed in said stocker, is provided in said recovery stocker.

28. The transporting method of claim 16, further comprising:

detecting the presence or absence of each of the plurality of semiconductor devices on said carrier on an IN side carrier stand;

detecting the presence or absence of each of the plurality of semiconductor devices on said carrier on an OUT side carrier stand; and comparing the detecting results with each other.

29. A transporting method used in testing semiconductor devices, comprising:

placing a plurality of semiconductor devices at prescribed positions on each of a plurality of pallets where openings are provided;

positioning a portion of the plurality of pallets on a carrier having through-holes;

pushing up each of said plurality of semiconductor devices through through-holes of the carrier and the openings of the pallet so that external terminals connected to the contactors of the test head.

30. A transporting method used in testing semiconductor devices, comprising:

supporting a test head via a test head supporting mechanism;

removably supporting a test board via the test head, the test board having first and second contactors and the test head having contactors in contact with said second contactors of the supported test board;

bringing the first contactors of the test board into contact with external terminals of semiconductors devices for testing said semiconductors devices while contacting the connectors of the test head;

ascending and descending a test head supporting mechanism supporting a test head, to take out said test head from a constant temperature room; and tilting said test head with respect to said test head supporting mechanism.

* * * * *